United States Patent
Kim et al.

(10) Patent No.: US 11,423,843 B2
(45) Date of Patent: Aug. 23, 2022

(54) SCAN DRIVER AND DISPLAY DEVICE HAVING THE SAME

(71) Applicant: Samsung Display Co., Ltd., Yongin-Si (KR)

(72) Inventors: Taehoon Kim, Hwaseong-si (KR); Sangan Kwon, Cheonan-si (KR); Soon-Dong Kim, Osan-si (KR); Hui Nam, Suwon-si (KR); Bonghyun You, Seoul (KR); Changnoh Yoon, Seoul (KR); Jaekeun Lim, Suwon-si (KR)

(73) Assignee: Samsung Display Co., Ltd.

( * ) Notice: Subject to any disclaimer, the term of this patent is extended or adjusted under 35 U.S.C. 154(b) by 0 days.

(21) Appl. No.: 17/342,585

(22) Filed: Jun. 9, 2021

(65) Prior Publication Data
US 2022/0157250 A1  May 19, 2022

(30) Foreign Application Priority Data
Nov. 18, 2020  (KR) .................. 10-2020-0154774

(51) Int. Cl.
*G09G 3/3266* (2016.01)
*G09G 3/3225* (2016.01)

(52) U.S. Cl.
CPC ......... *G09G 3/3266* (2013.01); *G09G 3/3225* (2013.01); *G09G 2310/0264* (2013.01); *G09G 2310/08* (2013.01); *G09G 2330/021* (2013.01)

(58) Field of Classification Search
CPC ............ G09G 3/3266; G09G 2310/0286
See application file for complete search history.

(56) References Cited

U.S. PATENT DOCUMENTS

| | | | |
|---|---|---|---|
| 10,198,998 B2 | 2/2019 | In et al. | |
| 11,030,958 B2* | 6/2021 | Chang | G09G 3/3266 |
| 2003/0122773 A1* | 7/2003 | Washio | G09G 3/3688 |
| | | | 345/103 |
| 2016/0140921 A1* | 5/2016 | Koyama | G09G 3/3655 |
| | | | 345/204 |
| 2017/0025068 A1 | 1/2017 | Jeoung et al. | |
| 2017/0186373 A1* | 6/2017 | Nishikawa | G09G 3/3266 |
| 2019/0035322 A1* | 1/2019 | Kim | H01L 27/1225 |

(Continued)

FOREIGN PATENT DOCUMENTS

| KR | 10-2015-0106370 A | 9/2015 |
|---|---|---|
| KR | 10-2016-0141132 A | 12/2016 |
| KR | 10-2019-0018932 A | 2/2019 |

*Primary Examiner* — Sepehr Azari

(74) *Attorney, Agent, or Firm* — Innovation Counsel LLP

(57) ABSTRACT

Provided is a scan driver of a display device, and the scan driver includes a driving circuit and a masking circuit. The driving circuit includes a control circuit, a first output circuit, and a second output circuit. The control circuit outputs a first control signal and a second control signal. The first output circuit is connected to a first output terminal which outputs a first scan signal and a first voltage terminal and operates in response to a first control signal. The second output circuit is connected to a first output terminal and a second voltage terminal and operates in response to a second control signal. The masking circuit outputs a second scan signal to a second output terminal in response to the first control signal and the second control signal and is connected to an input terminal to which a masking signal is supplied.

18 Claims, 23 Drawing Sheets

(56) References Cited

U.S. PATENT DOCUMENTS

| | | | |
|---|---|---|---|
| 2019/0103049 A1* | 4/2019 | Noh | G09G 3/3266 |
| 2019/0180834 A1* | 6/2019 | Yuan | G09G 3/3677 |
| 2020/0020266 A1* | 1/2020 | Feng | G11C 19/28 |
| 2020/0035182 A1* | 1/2020 | Bae | G09G 3/3696 |
| 2020/0135115 A1* | 4/2020 | Chang | G09G 3/3291 |

* cited by examiner

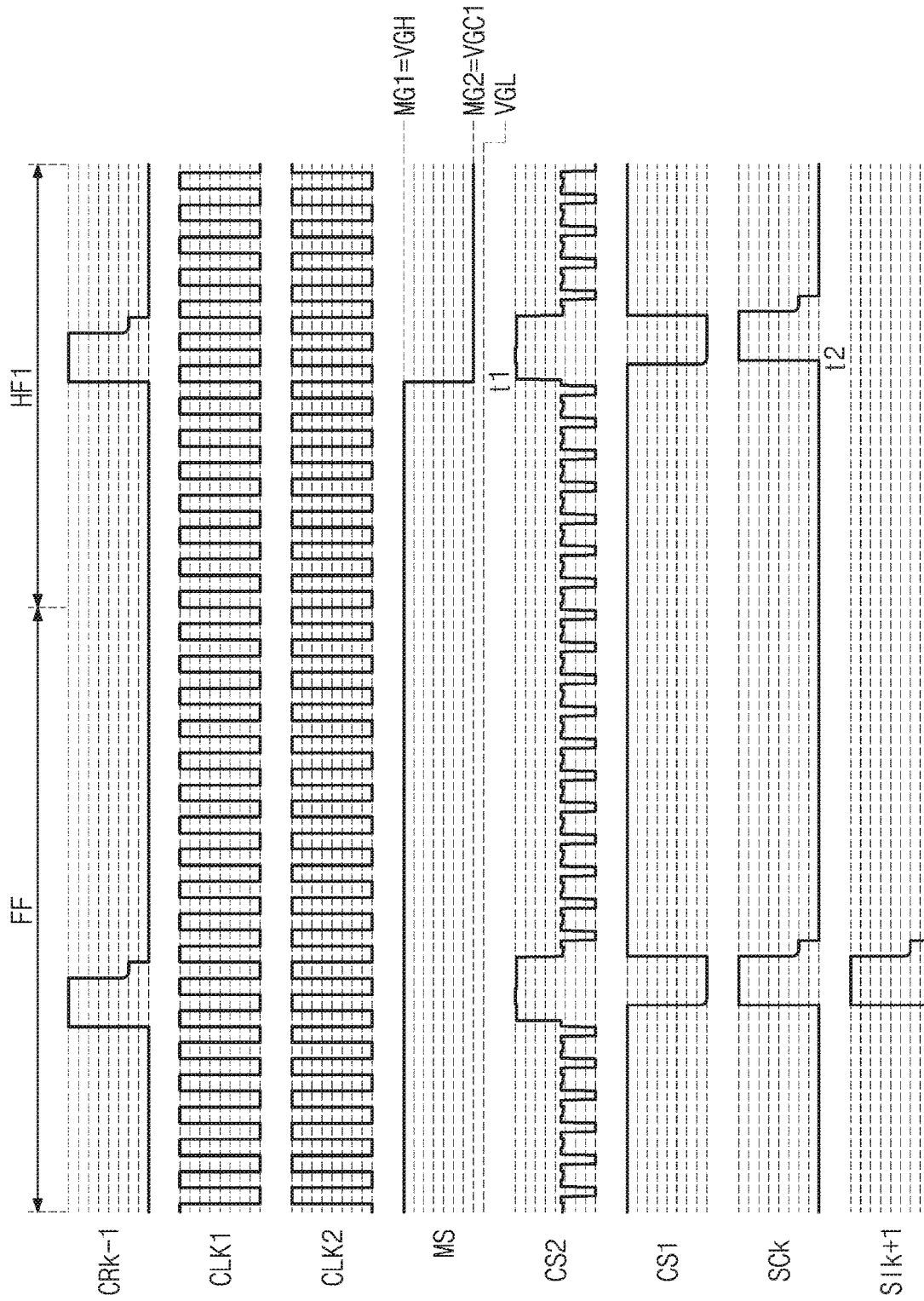

SCAN DRIVER AND DISPLAY DEVICE HAVING THE SAME

CROSS-REFERENCE TO RELATED APPLICATIONS

This U.S. non-provisional patent application claims priority under 35 U.S.C. § 119 to Korean Patent Application No. 10-2020-0154774, filed on Nov. 18, 2020, the entire contents of which are hereby incorporated by reference.

BACKGROUND

The present disclosure herein relates to a scan driver and a display device having the same, and more particularly, to a scan driver capable of reducing power consumption, and a display device having the scan driver.

Among display devices, an organic light emitting display device displays an image using an organic light emitting diode which generates light by recombination of electrons and holes. Such an organic light emitting display device has advantages of having fast response speed and being driven with low power consumption.

A display device includes a display device for displaying an image, a scan driver for sequentially supplying a scan signal to scan lines provided in the display panel, and a data driver for supplying data signals to data lines provided in the display panel.

Particularly, the scan driver may include a plurality of stages for outputting a scan signal to a corresponding scan line in synchronization with a predetermined clock. The scan driver repeats an operation of sequentially outputting a scan signal from the first stage to the last stage according to the same cycle every frame.

SUMMARY

The present disclosure provides a scan driver capable of reducing power consumption, and a display device having the same.

In an embodiment of the inventive concept, a scan driver includes a driving circuit and a masking circuit. The driving circuit includes a control circuit, a first output circuit, and a second output circuit. The control circuit outputs a first control signal to a first node and a second control signal to a second node in response to a clock signal and a carry signal. The first output circuit is connected to a first output terminal which outputs a first scan signal and to a first voltage terminal to which a first voltage is supplied and operates in response to a first control signal. The second output circuit is connected to a first output terminal and to a second voltage terminal to which a second voltage is supplied and operates in response to a second control signal. The masking circuit receives the first control signal and the second control signal and outputs a second scan signal to a second output terminal in response to the first control signal and the second control signal. and the masking circuit is connected to an input terminal to which a masking signal is supplied and controls the voltage level of the second scan signal in accordance with the masking signal.

In an embodiment of the inventive concept, a display device includes a display panel including a plurality of pixels respectively connected to a plurality of data lines, a plurality of compensation scan lines, and a plurality of initialization scan lines, a data driver configured to drive the plurality of data lines, a scan driver configured to drive the plurality of compensation scan lines and the plurality of initialization scan lines, and a driving controller configured to control the data driver and the scan driver so as to allow an image to be displayed on the display panel.

The scan driver includes a driving stage configured to output a compensation scan signal to a corresponding compensation scan line among the compensation scan lines, and to output an initialization scan signal to a corresponding initialization scan line among the initialization scan lines.

The driving stage includes a driving circuit and a masking circuit. The driving circuit includes a control circuit, a first output circuit, and a second output circuit. The control circuit outputs a first control signal to a first node and a second control signal to a second node in response to a clock signal and a carry signal. The first output circuit is connected to a first output terminal which outputs a first scan signal and to a first voltage terminal to which a first voltage is supplied and operates in response to a first control signal. The second output circuit is connected to a first output terminal and to a second voltage terminal to which a second voltage is supplied and operates in response to a second control signal. The masking circuit receives the first control signal and the second control signal and outputs a second scan signal to a second output terminal in response to the first control signal and the second control signals. The masking circuit is connected to an input terminal to which a masking signal is supplied and controls the voltage level of the second scan signal in accordance with the masking signal.

BRIEF DESCRIPTION OF THE FIGURES

The accompanying drawings are included to provide a further understanding of the inventive concept and are incorporated in and constitute a part of this specification. The drawings illustrate embodiments of the inventive concept and, together with the description, serve to explain principles of the inventive concept. In the drawings:

FIG. 7B, FIG. 7C and FIG. 7D are waveform diagrams showing a masking signal, first and second clock signals, an initialization scan signal, and a compensation scan signal which are illustrated in FIG. 7A;

DETAILED DESCRIPTION

Figure 1A:
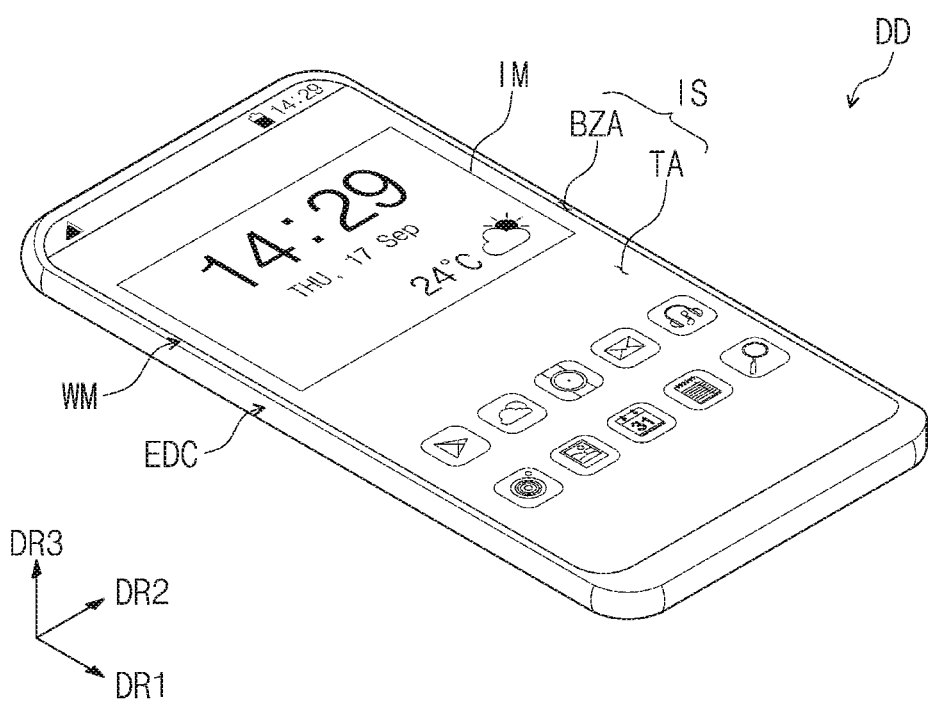
FIG. 1A is a perspective view of a display device according to an embodiment of the inventive concept.

In the present disclosure, when an element (or a region, a layer, a portion, etc.) is referred to as being "on," "connected to," or "coupled to" another element, it means that the element may be directly disposed on/connected to/coupled to the other element, or that a third element may be disposed therebetween.

Like reference numerals refer to like elements. Also, in the drawings, the thickness, the ratio, and the dimensions of elements are exaggerated for an effective description of technical contents. The term "and/or," includes all combinations of one or more of which associated configurations may define.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the inventive concept. The terms of a singular form may include plural forms unless the context clearly indicates otherwise.

In addition, terms such as "below," "lower," "above," "upper," and the like are used to describe the relationship of the configurations shown in the drawings. The terms are used as a relative concept and are described with reference to the direction indicated in the drawings.

It should be understood that the terms "comprise", or "have" are intended to specify the presence of stated features, integers, steps, operations, elements, components, or combinations thereof in the disclosure, but do not preclude the presence or addition of one or more other features, integers, steps, operations, elements, components, or combinations thereof.

Unless otherwise defined, all terms (including technical and scientific terms) used herein have the same meaning as commonly understood by one of ordinary skill in the art to which the inventive concept pertains. It is also to be understood that terms defined in commonly used dictionaries should be interpreted as having meanings consistent with the meanings in the context of the related art and are expressly defined herein unless they are interpreted in an ideal or overly formal sense.

Hereinafter, embodiments of the inventive concept will be described with reference to the accompanying drawings.

Figure 1B:
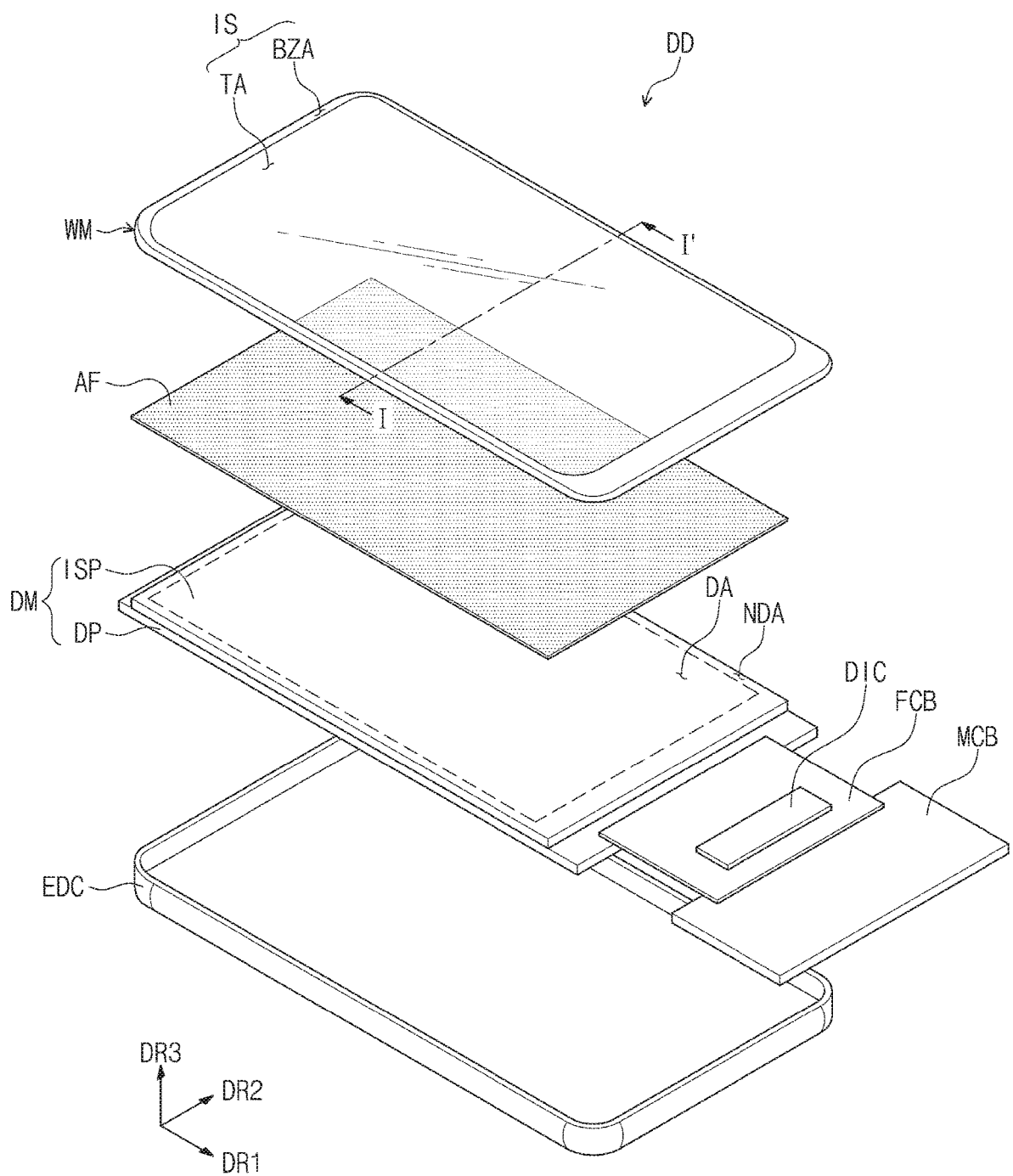
FIG. 1B is an exploded perspective view of a display device according to an embodiment of the inventive concept.
Figure 1C:
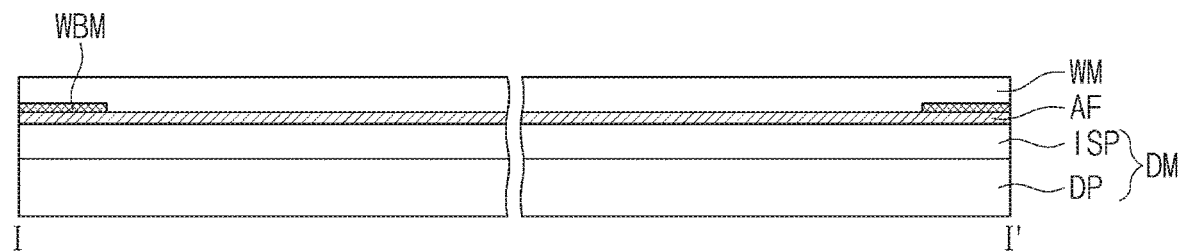
FIG. 1C and FIG. 1D are cross-sectional views of a display device taken along line I-I' illustrated in FIG. 1B.
Figure 1D:
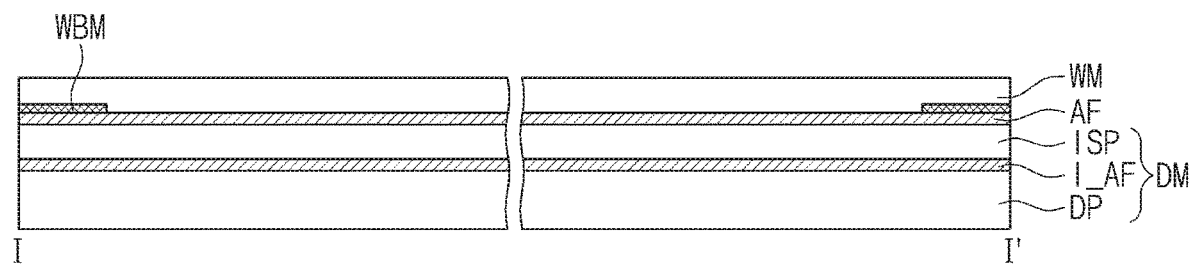

FIG. 1A is a perspective view of a display device according to an embodiment of the inventive concept, and FIG. 1B is an exploded perspective view of a display device according to an embodiment of the inventive concept. FIG. 1C and FIG. 1D are cross-sectional views of a display device taken along line I-I' illustrated in FIG. 1B.

Referring to FIG. 1A and FIG. 1B, a display device DD may be a device activated by an electrical signal. The display device DD may be applied to an electronic apparatus such as a smart watch, a tablet computer, a laptop, a desktop, a smart television, and the like.

The display device DD may display an image IM toward a third direction DR3 on a display surface IS which is parallel to a plane defined by a first direction DR1 and a second direction DR2. The display surface IS on which the image IM is displayed may correspond to a front surface of the display device DD. The image IM may include both a moving image and a still image.

In the present embodiment, a front surface (or an upper surface) and a back surface (or a lower surface) of each constituent element are defined on the basis of a direction in which the image IM is displayed. The front surface and the back surface oppose each other in the third direction DR3 and the normal direction of each of the front surface and the back surface may be parallel to the third direction DR3.

A distance between the front surface and the back surface in the third direction DR3 may correspond to a thickness of the display device DD in the in the third direction DR3. Meanwhile, directions indicated by the first to third directions DR1, DR2, and DR3 are a relative concept, and may be altered to different directions.

The display device DD may sense an external input applied from the outside. The external input may include various forms of input provided from the outside of the display device DD. For example, the external input may include not only a contact of a user's body, such as a hand, but also an external input applied in close proximity, or adjacent to the display device DD at a predetermined distance (for example, hovering). Also, the external input may have various forms such as force, pressure, temperature, light, and the like.

The display surface IS of the display device DD may include a transmissive region TA and a bezel region BZA defined thereon. The transmissive region TA may be a region on which the image IM is displayed. A user visually recognizes the image IM through the transmissive region TA. In the present embodiment, the transmissive region TA is illustrated as having corners in a rounded quadrangular shape. However, this is only an example. The transmissive region TA may have various shapes and is not limited to any one embodiment.

The bezel region BZA is disposed adjacent to the transmissive region TA. The bezel region BZA may have a predetermined color. The bezel region BZA may surround the transmissive region TA. Accordingly, the shape of the transmissive region TA may be substantially defined by the shape of the bezel region BZA. However, this is only an example. The bezel region BZA may be disposed adjacent to only one side of the transmissive region TA or may be omitted. The display device DD according to an embodiment of the inventive concept may include various embodiments and is not limited to any one embodiment.

As illustrated in FIG. 1B, the display device DD may include a display module DM, and a window WM disposed on the display module DM. The display module DM may include a display panel DP and an input sensor ISP.

The display panel DP according to an embodiment of the inventive concept may be a light emitting type display panel but is not particularly limited thereto. For example, the display panel DP may be an organic light emitting display panel or a quantum dot light emitting display panel. A light emitting layer of the organic light emitting display panel may include an organic light emitting material. A light emitting layer of the quantum dot light emitting display panel may include a quantum dot, a quantum load, and the like. Hereinafter, the display panel DP is described as an organic light emitting display panel.

Referring to FIG. 1C, the input sensor ISP may be formed directly on the display panel DP. According to an embodiment of the inventive concept, the input sensor ISP may be formed directly on the display panel DP by a continuous process. That is, when the input sensor ISP is formed directly on the display panel DP, an adhesive film may not be disposed between the input sensor ISP and the display panel DP. However, as illustrated in FIG. 1D, an inner adhesive film I_AF may be disposed between the input sensor ISP and the display panel DP. In this case, the input sensor ISP is not manufactured by a continuous process with the display panel DP but may be manufactured through a separate process from the display panel DP and then fixed on an upper surface of the display panel DP using the inner adhesive film I-AF.

The display panel DP generates an image and the input sensor ISP obtains a coordinate information of the external input.

The window WM may be made of a transparent material capable of allowing the image IM to pass through the window WM without appreciable scattering of light. For example, the window WM may be composed of glass, sapphire, plastic, or the like. The window WM is illustrated as being a single layer but the embodiment of the inventive concept is not limited thereto. The window WM may include a plurality of layers. Meanwhile, although not illustrated, the bezel region BZA of the display device DD described above may be substantially provided as a region in which a material including a predetermined color is printed in one region of the window WM. As an example of the inventive concept, the window WM may include a light blocking pattern WBM for defining the bezel region BZA. The light blocking pattern WBM is a colored organic film and may be formed through a coating manner.

The window WM may be coupled to the display module DM through an adhesive film AF. As an example of the inventive concept, the adhesive film AF may include an optically clear adhesive (OCA) film. However, the adhesive film AF is not limited thereto, and may include a typical adhesive or a typical pressure-sensitive adhesive. For example, the adhesive film AF may include an optically clear resin (OCR) or a pressure sensitive adhesive film (PSA).

Between the window WM and the display module DM, a reflection prevention layer may further be disposed. The reflection prevention layer reduces the reflectance of an external light incident from an upper side of the window WM. The refection prevention layer according to an embodiment of the inventive concept may include a phase retarder and a polarizer. The phase retarder may be of a film type or a liquid crystal coating type and may include a $\lambda/2$ phase retarder and/or a $\lambda/4$ phase retarder. The polarizer may also be a film type or a liquid crystal coating type. The film type polarizer may include a stretchable synthetic resin film, and the liquid crystal coating type polarizer may include liquid crystals arranged in a predetermined arrangement. The phase retarder and the polarizer may be implemented as a single polarizing film.

The display module DM displays the image IM in accordance with an electrical signal and may transmit/receive information on an external input. The display module DM may include a display region DA and a non-display region NDA. The display region DA may be defined as a region which displays the image IM.

The non-display region NDA is disposed adjacent to the display region DA. For example, the non-display region NDA may surround the display region DA. However, the non-display region NDA may have various shapes and is not limited to any one embodiment. According to an embodiment, the display region DA of the display module DM may correspond to at least a portion of the transmissive region TA.

The display module DM may further include a main circuit board MCB, a flexible circuit film FCB, and a driving chip DIC. The main circuit board MCB may be connected to the flexible circuit film FCB, and thus, electrically connected to the display panel DP through the flexible circuit film FCB. The main circuit board MCB may include a plurality of driving elements. The plurality of driving elements may include circuits for driving the display panel DP. The flexible circuit film FCB is connected to the display panel DP to electrically connect the display panel DP and the main circuit board MCB. The driving chip DIC may be mounted on the flexible circuit film FCB.

The driving chip DIC may include driving elements for driving pixels of the display panel DP, for example, a data driving circuit. Although there is illustrated one flexible circuit film FCB according to an embodiment of the inventive concept, the embodiment of the inventive concept is not limited thereto. The flexible circuit film FCB may include a plurality of flexible circuit films FCB connected to the display panel DP. FIG. 1B illustrates a structure in which the driving chip DIC is mounted on the flexible circuit film FCB but the inventive concept is not limited thereto. For example, the driving chip DIC may be disposed directly on the display panel DP. In this case, a portion of the display panel DP on which the driving chip DIC is mounted may be bent and disposed on a back surface of the display module DM.

The input sensor ISP may be electrically connected to the main circuit board MCB through the flexible circuit film FCB. However, the embodiment of the inventive concept is not limited thereto. That is, the display module DM may be connected to the main circuit board MCB through an additional flexible circuit film for electrically connecting the input sensor ISP to the main circuit board MCB.

The display device DD further includes an external case EDC which receives the display module DM. The external case EDC may be coupled to the window WM and define the exterior of the display device DD. The external case EDC absorbs impacts applied from the outside and prevents foreign materials/moisture and the like from penetrating into the module DM to protect components in the external case EDC. Meanwhile, as an example of the inventive concept, the external case EDC may be provided in a form in which a plurality of housings are coupled to each other.

The display device DD according to an embodiment may further include an electronic module including various functional modules for operating the display module DM, a power supply module for supplying power necessary for the overall operation of the display device DD, a bracket coupled to the display module DM and/or the external case EDC and dividing the inner space of display device DD, and the like.

Figure 2A:
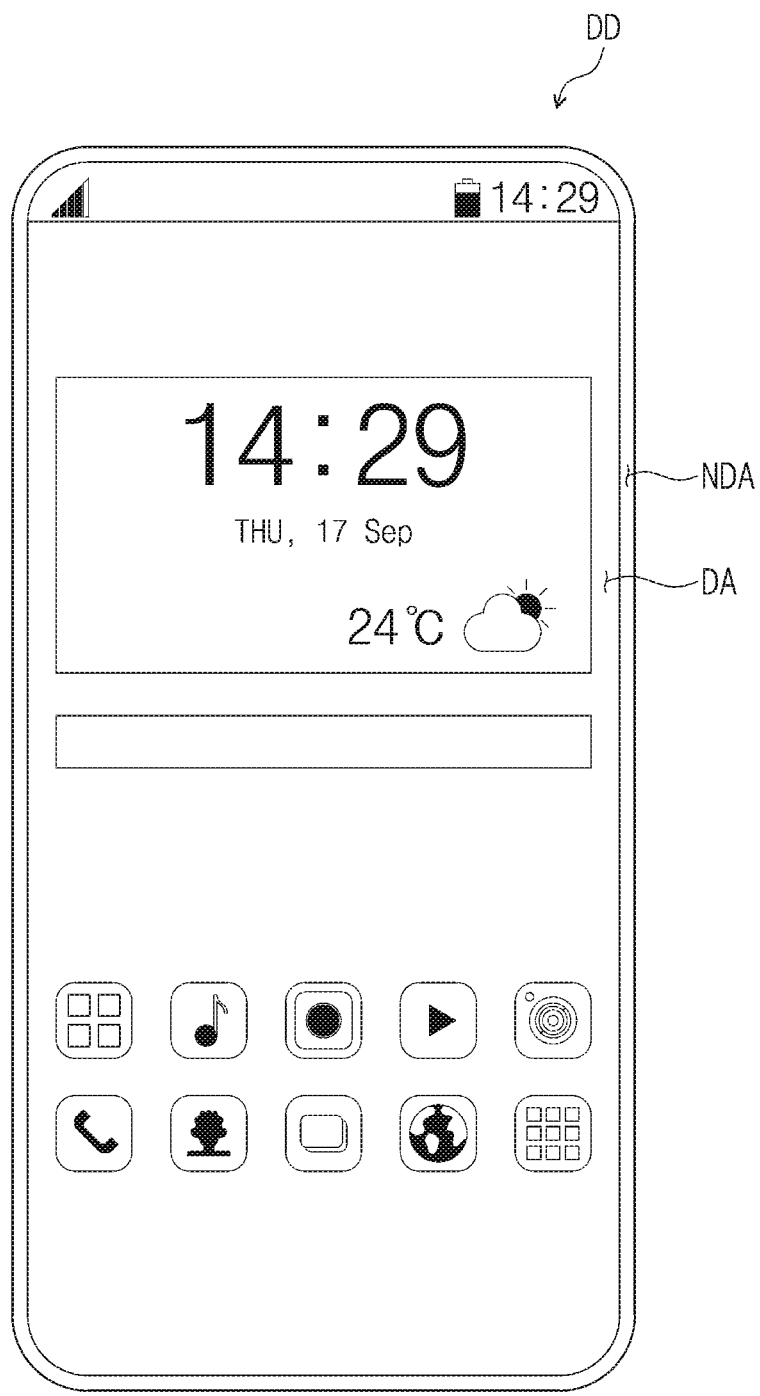
FIG. 2A is a plan view showing a screen of a display device which operates in a normal frequency mode according to an embodiment of the inventive concept.
Figure 2B:
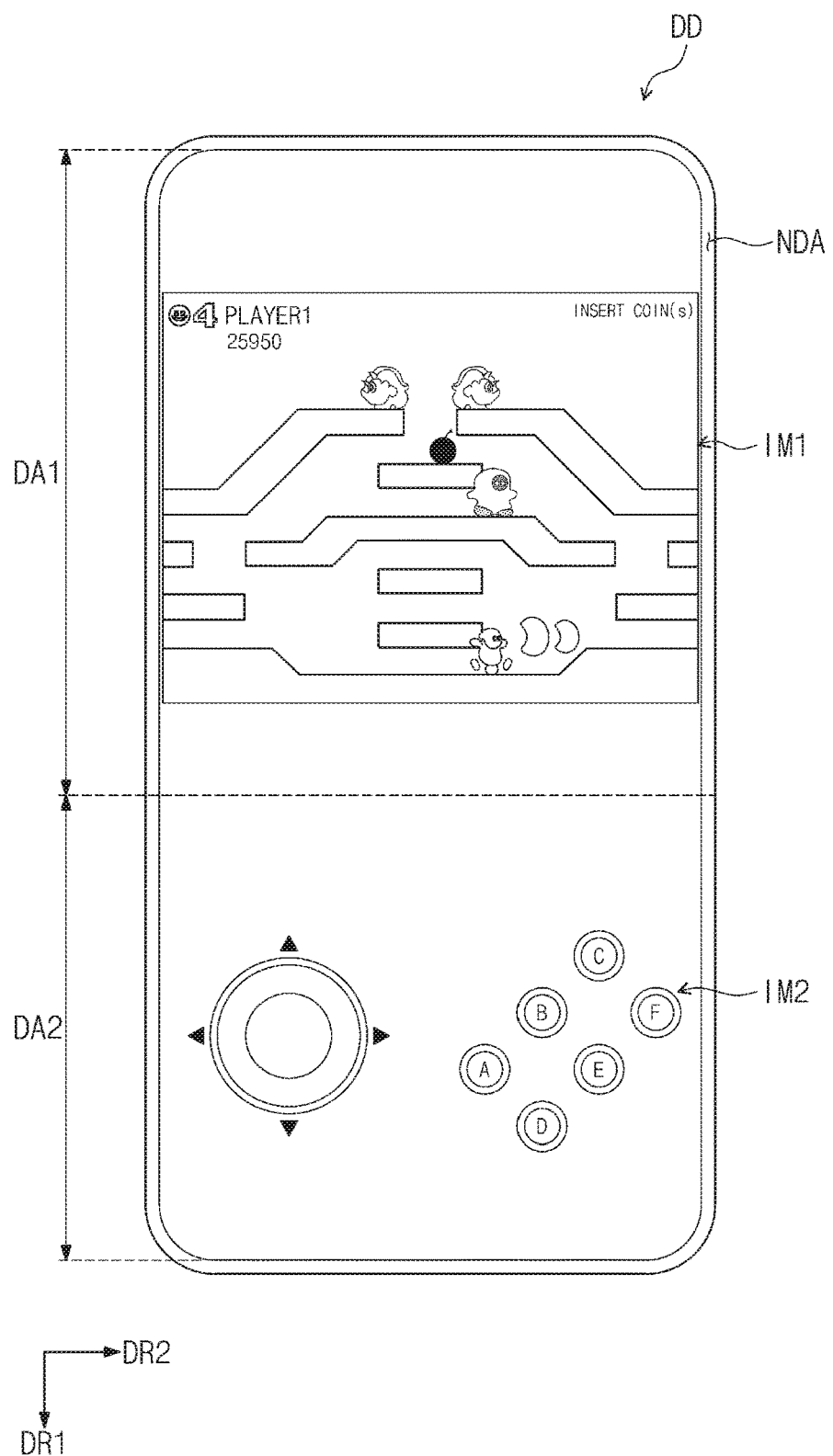
FIG. 2B is a plan view showing a screen of a display device which operates in a multi-frequency mode according to an embodiment of the inventive concept.
Figure 3A:
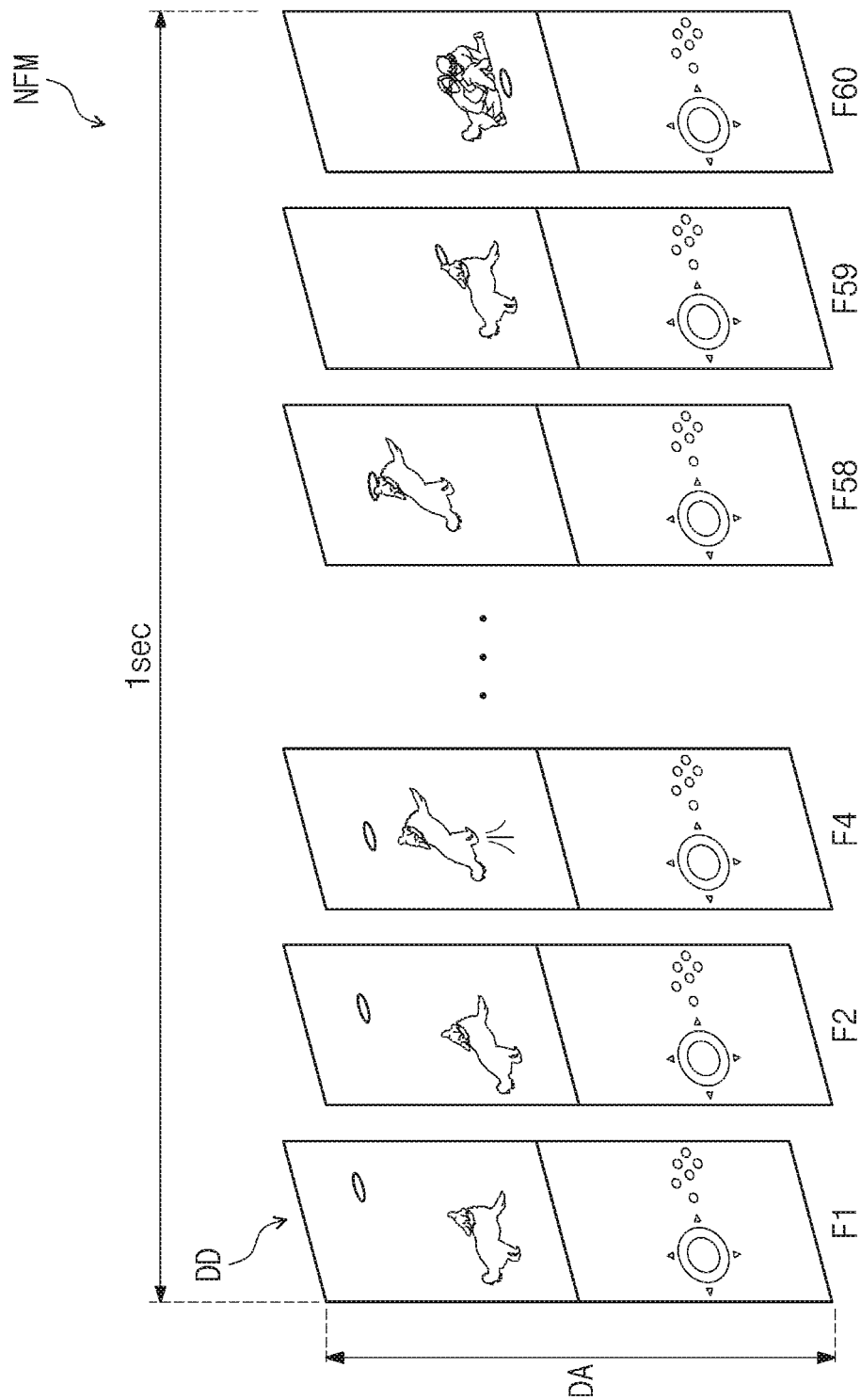
FIG. 3A is a view for describing the operation of a display device in a normal frequency mode according to an embodiment of the inventive concept.
Figure 3B:
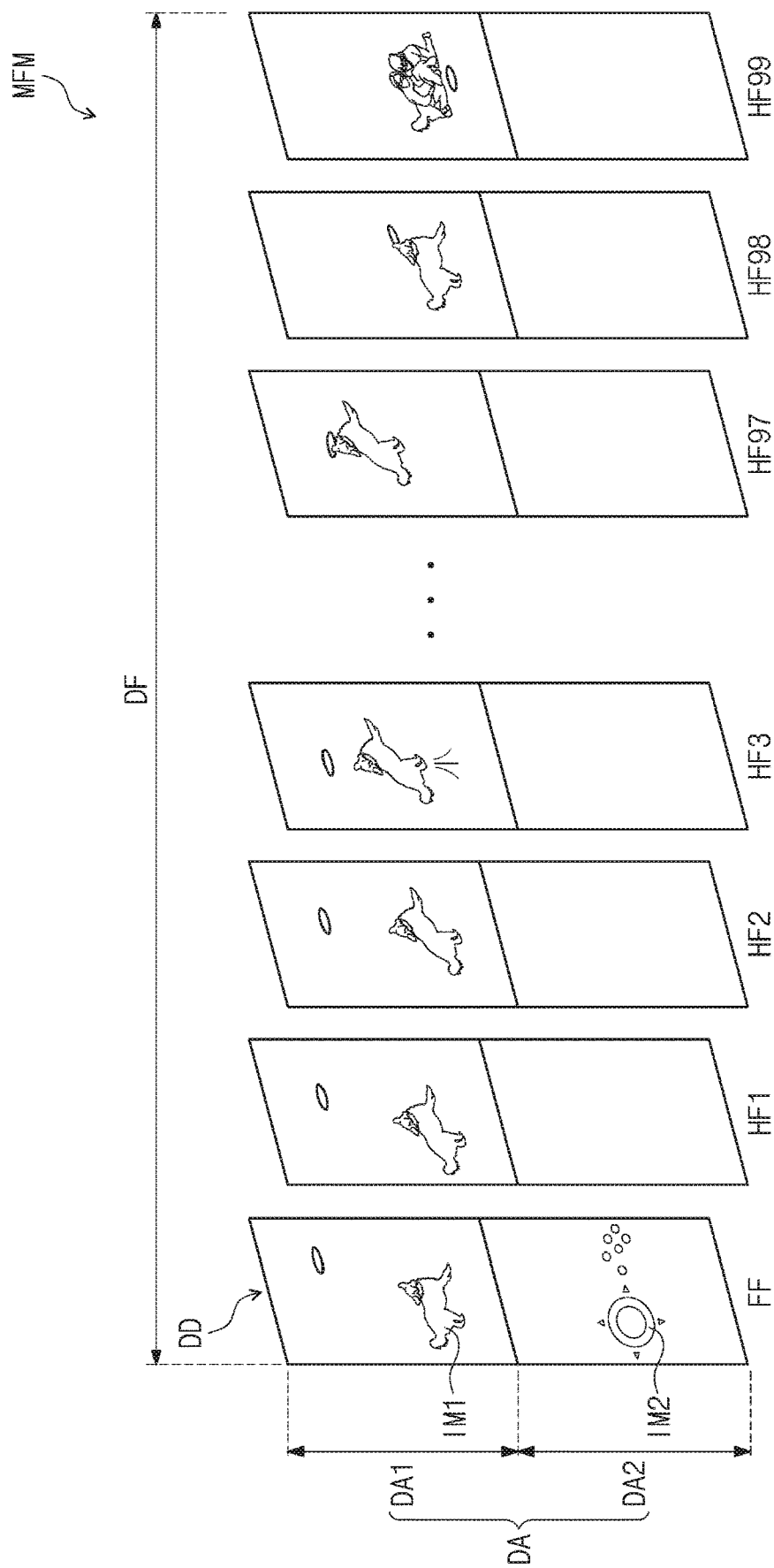
FIG. 3B is a view for describing the operation of a display device in a multi-frequency mode according to an embodiment of the inventive concept.

FIG. 2A is a plan view showing a screen of a display device which operates in a normal frequency mode, and FIG. 2B is a plan view showing a screen of a display device which operates in a multi-frequency mode. FIG. 3A is a view for describing the operation of a display device in a normal frequency mode, and FIG. 3B is a view for describing the operation of a display device in a multi-frequency mode.

Referring to FIG. 2A to FIG. 3B, the display device DD may display an image in a normal frequency mode NFM or in a multi-frequency mode MFM. The display region DA of the display device DD is not divided into a plurality of display regions having different driving frequencies in the normal frequency mode NFM. That is, the display region DA is operated at one driving frequency in the normal frequency mode NFM, and the driving frequency of the display region DA in the normal frequency mode NFM may be defined as a normal frequency. For example, the normal frequency may be 60 Hz. 60 frames that include a first frame F1 to a sixtieth frame F60 may be displayed in the display region DA of the display device DD for 1 second (1 sec) in the normal frequency mode NFM.

The display region DA of the display device DD is divided into a plurality of display regions having different driving frequencies in the multi-frequency mode MFM. As an example of the inventive concept, the display region DA may include a first display region DA1 and a second display region DA2 in the multi-frequency mode MFM. The first and second display regions DA1 and DA2 are disposed adjacent to each other in the first direction DR1. The driving frequency of the first display region DA1 may be a frequency higher than or equal to the normal frequency, and the driving frequency of the second display region DA2 may be a frequency lower than the normal frequency. For example, when the normal frequency is 60 Hz, the driving frequency of the first display region DA1 may be 60 Hz, 80 Hz, 90 Hz, 100 Hz, 120 Hz, or the like, and the driving frequency of the second display region DA2 may be 1 Hz, 20 Hz, 30 Hz, 40 Hz, or the like.

As an example of the inventive concept, the first display region DA1 may be a region in which a moving image which requires high-speed driving (hereinafter, referred to as a first image IM1) or the like is displayed, and the second display region DA2 may be a region in which a still image which does not require a high-speed driving or a text image which is not changed frequently (hereinafter, referred to as a second image IM2) or the like is displayed. Therefore, when a still image and a moving image are simultaneously displayed on the screen of the display device DD, the display device DD may be operated in the multi-frequency mode MFM to improve the display quality of the moving image and to reduce overall power consumption.

Referring to FIG. 3A and FIG. 3B, an image may be displayed for a plurality of driving frames DF in the display region DA of the display device DD in the multi-frequency mode MFM. Each of the driving frames DF may include a full frame FF in which the first display region DA1 and the second display region DA2 are driven and partial frames in which only the first display region DA1 is driven. Each of the partial frames may have a shorter duration than the full frame. The number of partial frames included in each driving frame DF may be the same to or different from each other. Each driving frame DF may be defined as an interval between a current full frame and a next full frame.

As an example of the inventive concept, during each driving frame DF, the first display region DA1 may operate at 100 Hz, and the second display region DA2 may operate at 1 Hz. In this case, each driving frame DF has a duration corresponding to 1 second (1 sec) and may include one full frame FF and 99 partial frames HF1 to HF99. During each driving frame DF, 100 first images IM1 corresponding to the full frame FF and the 99 partial frames HF1 to HF99 may be displayed in the first display region DA1 of the display device DD and one second image IM2 corresponding to the full frame FF may be displayed in the second display region DA2.

In FIG. 3B, for convenience of description, an example in which the driving frequency of the first display region DA1 is 100 Hz and the driving frequency of the second display region DA2 is 1 Hz in the multi-frequency mode MFM is illustrated but the inventive concept is not limited thereto. For example, the driving frequency of the first display region DA1 may be 100 Hz and the driving frequency of the second display region DA2 may be 20 Hz. In this case, during each driving frame DF, 5 first images IM1 corresponding to one full frame FF and 4 partial frames may be displayed in the first display region DA1 of the display device DD, and one second image IM2 corresponding to the full frame FF may be displayed in the second display region DA2. In addition, the driving frequency of the first display region DA1 may be 90 Hz, and the driving frequency of the second display region DA2 may be 30 Hz. In this case, during each driving frame DF, 3 first images IM1 corresponding to one full frame FF and 2 partial frames may be displayed in the first display region DA1 of the display device DD, and one second image IM2 corresponding to the full frame FF may be displayed in the second display region DA2.

Figure 4:
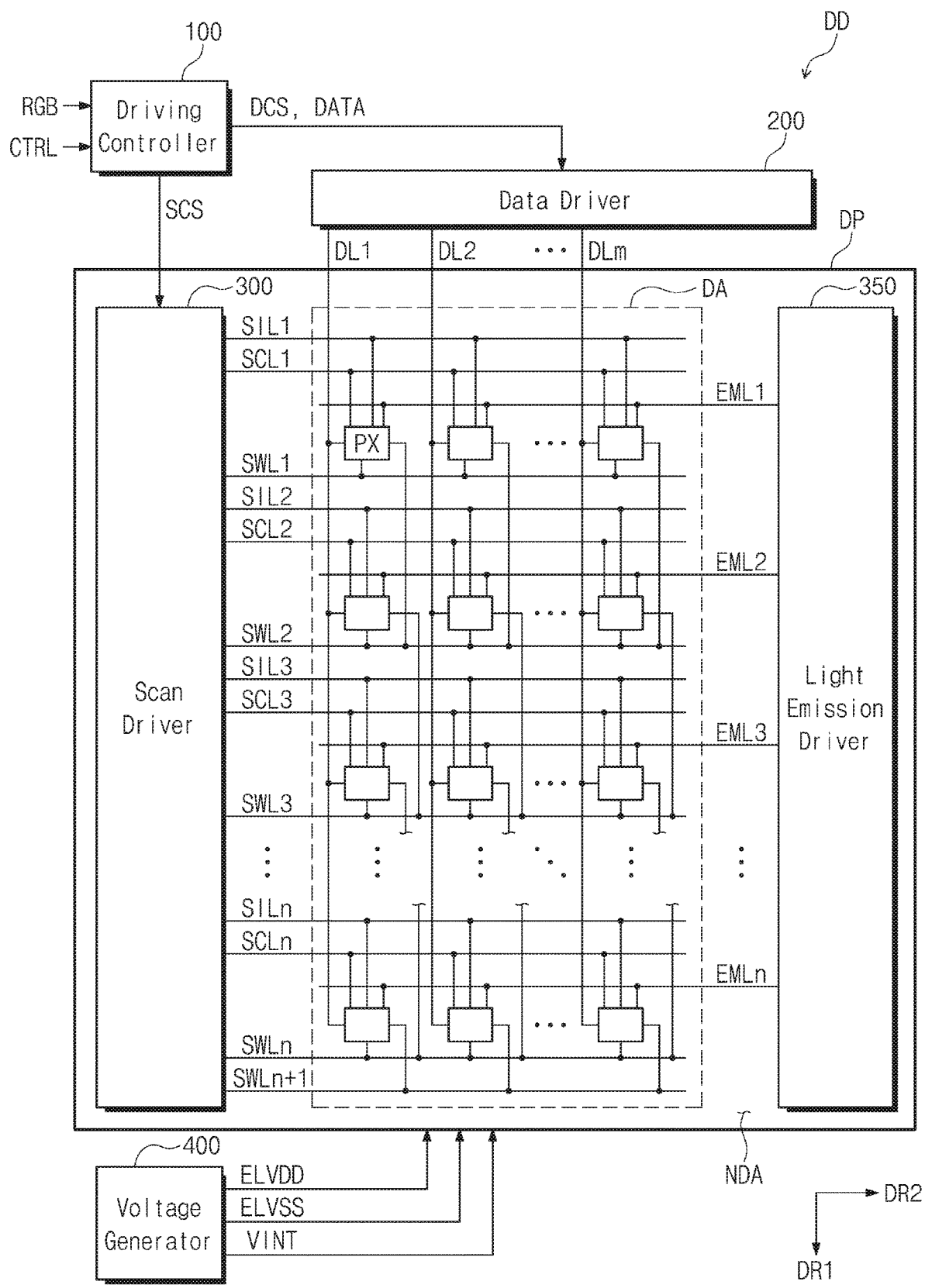
FIG. 4 is a block diagram of a display device according to an embodiment of the inventive concept.
Figure 5:
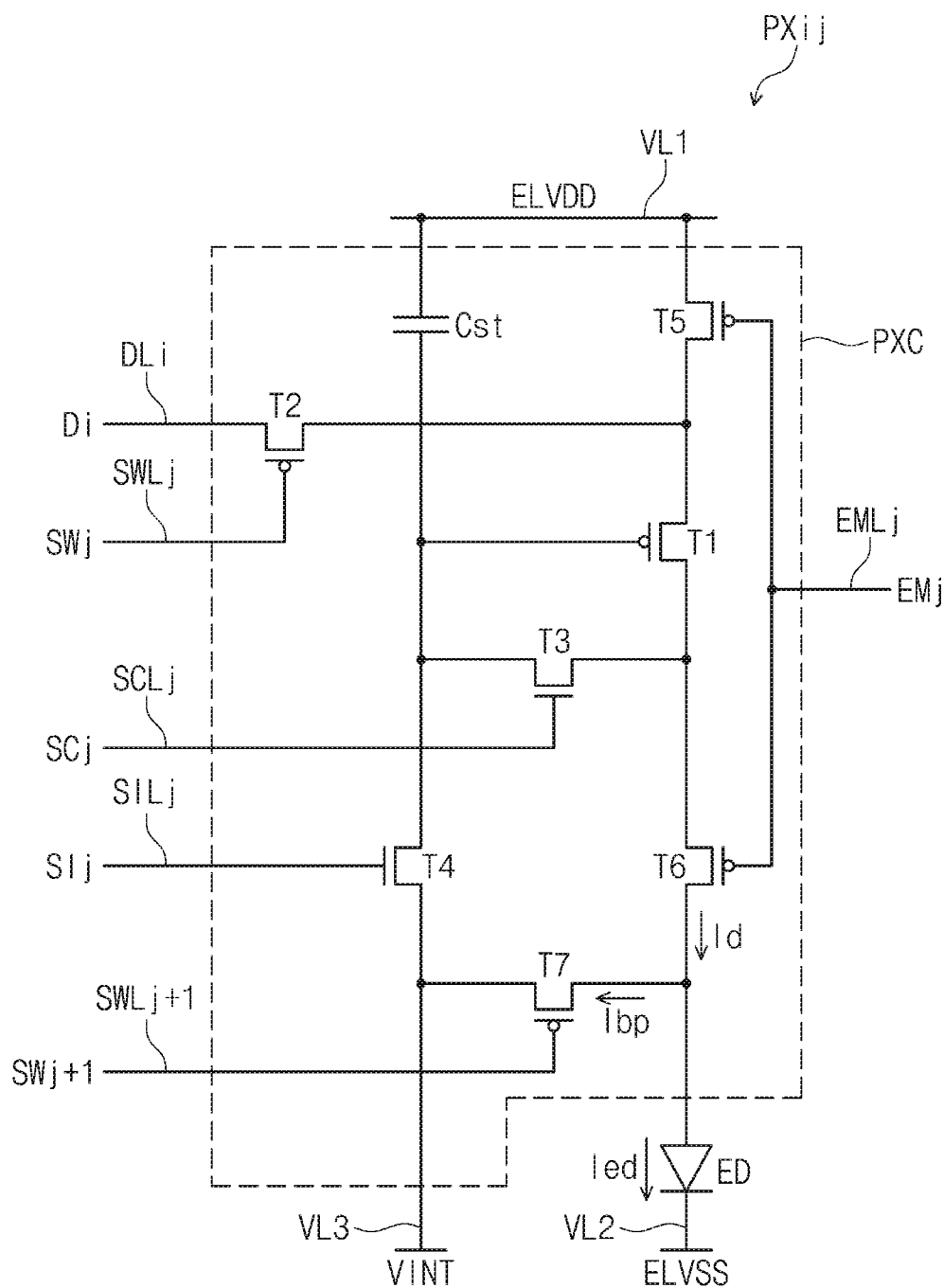
FIG. 5 is a circuit diagram of a pixel according to an embodiment of the inventive concept.

FIG. 4 is a block diagram of a display device according to an embodiment of the inventive concept, and FIG. 5 is a circuit diagram of a pixel according to an embodiment of the inventive concept.

Referring to FIG. 4 and FIG. 5, the display device DD includes the display panel DP, a panel driver, and a driving controller 100. As an example of the inventive concept, the panel driver includes a data driver 200, a scan driver 300, a light emission driver 350, and a voltage generator 400.

The driving controller 100 receives an image signal RGB and a control signal CTRL. The driving controller 100 generates an image data signal DATA obtained by converting the data format of the image signal RGB to meet the interface specifications of the data driver 200. The driving controller 100 outputs a scan control signal SCS and a data control signal DCS.

The data driver 200 receives the data control signal DCS and the image data signal DATA from the driving controller 100. The data driver 200 converts the image data signal DATA into data signals and outputs the data signals to a plurality of data lines DL1 to DLm to be described later. The data signals are analog voltages corresponding to gray scale values of the image data signal DATA.

The scan driver 300 receives the scan control signal SCS from the driving controller 100. The scan driver 300 may output scan signals to scan lines in response to the scan control signal SCS.

The voltage generator 400 generates voltages required for the operation of the display panel DP. In this embodiment, the voltage generator 400 generates a first driving voltage ELVDD, a second driving voltage ELVSS, and an initialization voltage VINT.

The display panel DP includes initialization scan lines SIL1 to SILn, compensation scan lines SCL1 to SCLn, write scan lines SWL1 to SWLn+1, light emission control lines EML1 to EMLn, data lines DL1 to DLm, and pixels PX. The initialization scan lines SIL1 to SILn, the compensation scan lines SCL1 to SCLn, the write scan lines SWL1 to SWLn+1, the light emission control lines EML1 to EMLn, the data lines DL1 to DLm, and the pixels PX may overlap the display region DA. The initialization scan lines SIL1 to SILn, the compensation scan lines SCL1 to SCLn, the write scan lines SWL1 to SWLn+1, and the light emission control lines EML1 to EMLn extends in the second direction DR2. The initialization scan lines SIL1 to SILn, the compensation scan lines SCL1 to SCLn, the write scan lines SWL1 to SWLn, and the light emission control lines EML1 to EMLn are arranged spaced apart from each other in the first direction DR1. The data lines DL1 to DLm extend in the first direction DR1 and arranged spaced apart from each other in the second direction DR2.

A plurality of pixels PX are electrically connected to the initialization scan lines SIL1 to SILn, the compensation scan lines SCL1 to SCLn, the write scan lines SWL1 to SWLn+1, the light emission control lines EML1 to EMLn, the data lines DL1 to DLm, respectively. Each of the plurality of pixels PX may be electrically connected to 3 scan lines. For example, as illustrated in FIG. 4, pixels PX in the first row may be connected to a first initialization scan line SILL a first compensation scan line SCL1, and a first write scan line SWL1. In addition, pixels PX in the second row may be connected to a second initialization scan line SIL2, a second compensation scan line SCL2, and a second write scan line SWL2.

The scan driver 300 may be disposed in the non-display region NDA of the display panel DP. The scan driver 300 receives the scan control signal SCS from the driving controller 100. The scan driver 300 may output initialization scan signals to the initialization scan lines SIL1 to SILn in response to the scan control signal SCS, output compensation scan signals to the compensation scan lines SCL1 to SCLn, and output write scan signals to the write scan lines SWL1 to SWLn+1. The circuit configuration and operation of the scan driving circuit 300 will be described in detail later.

The light emission driver 350 may output light emission control signals to the light emission control lines EML1 to EMLn. In an embodiment, the scan driver 300 may be connected to the light emission control lines EML1 to EMLn. In this case, the scan driver 300 may output light emission control signals to the light emission control lines EML1 to EMLn.

Each of the plurality of pixels PX includes a light emitting diode ED, and a pixel circuit PXC which controls the light emission of the light emitting diode ED. The pixel circuit PXC may include a plurality of transistors and a capacitor. The scan driver 300 may include transistors formed through the same process as the pixel circuit PXC.

Each of the plurality of pixels PX receives the first driving voltage ELVDD, the second driving voltage ELVSS, and the initialization voltage VINT from the voltage generator 400.

FIG. 5 illustrates an equivalent circuit diagram of one pixel PXij among the plurality of pixel illustrated in FIG. 4. Because each of the plurality of pixels has the same circuit structure with the circuit structure for the pixel PXij, the detailed description of the rest of the pixels will be omitted.

The pixel PXij is connected to an i-th data line DLi (hereinafter, a data line) among the data lines DL1 to DLm, a j-th initialization scan line SILj (hereinafter, an initialization scan line) among the initialization scan lines SIL1 to SILn, a j-th compensation scan line SCLj (hereinafter, a compensation scan line) among the compensation scan lines SCL1 to SCLn, j-th and j+1-th write scan lines SWLj and SWLj+1 (hereinafter, first and second write scan lines) among the write scan lines SWL1 to SWLn, and a j-th light emission control line EMLj (hereinafter, a light emission control line) among the light emission control lines EML1 to EMLn.

The pixel PXij includes the light emitting diode ED and the pixel circuit PXC. The pixel circuit PXC includes first to seventh transistors T1, T2, T3, T4, T5, T6, and T7, and one capacitor Cst. Each of the first to seventh transistors T1 to T7 may be a transistor having a low-temperature polycrystalline silicon (LTPS) semiconductor layer. Some of the first to seventh transistors T1 to T7 may be P-type transistors, and the others thereof may be N-type transistors. For example, first, second, and fifth to seventh transistors T1, T2, and T5 to T7 among the first to seventh transistors T1 to T7 may be P-type transistors, and third and fourth transistors T3 and T4 may be N-type transistors having an oxide semiconductor as a semiconductor layer. In an embodiment, at least one of the first to seventh transistors T1 to T7 may be an N-type transistor, and the rest thereof may be P-type transistors. The configuration of the pixel circuit PXC according to the inventive concept is not limited to the embodiment illustrated in FIG. 5. The pixel circuit PXC illustrated in FIG. 5 is only an example, and the configuration of the pixel circuit PXC may be modified and implemented. For example, all of the first to seventh transistors T1 to T7 may be P-type transistors or N-type transistors.

The initialization scan line SILj, the compensation scan line SCLj, the first and second write scan lines SWLj and SWLj+1, the light emission control line EMLj may respectively transmit a j-th initialization scan signal SIj (hereinafter, an initialization scan signal), a j-th compensation scan signal SCj (hereinafter, a compensation scan signal), j-th and j+1-th write scan signal SWj and SWj+1 (hereinafter, first and second write scan signals), and a j-th light emission control signal EMj, (hereinafter, a light emission control signal) to the pixel PXij, respectively. The data line DLi transmits a data signal Di to the pixel PXij. The data signal Di may have a voltage level corresponding to the image signal RGB input to the display device DD (see FIG. 4). First to third driving voltage lines VL1, VL2, and VL3 may respectively transmit the first driving voltage ELVDD, the second driving voltage ELVSS, and the initialization voltage VINT to the pixel PXij.

A first transistor T1 includes a first electrode connected to a first driving voltage line VL1 via a fifth transistor T5, a second electrode electrically connected to an anode of the light emitting diode ED via a sixth transistor T6, and a gate electrode connected to one end of the capacitor Cst. The first transistor T1 may receive the data signal Di transmitted by the data line DLi in response to the switching operation of a second transistor T2 and supply a driving current Id to the light emitting diode ED.

The second transistor T2 includes a first electrode connected to the data line DLi, a second electrode connected to the first electrode of the first transistor T1, and a gate electrode connected to the first write scan line SWLj. The second transistor T2 may be turned on in response to the first write scan signal SWj received through the first write scan line SWLj and transmit the data signal Di transmitted from the data line DLi to the first electrode of the first transistor T1.

A third transistor T3 includes a first electrode connected to the gate electrode of the first transistor T1, a second electrode connected to the second electrode of the first transistor T1, and a gate electrode connected to the compensation scan line SCLj. The third transistor T3 may be turned on in response to the compensation scan line SCj received through the compensation scan line SCLj and connect the gate electrode of the first transistor T1 and the second electrode thereof to diode connect the first transistor T1.

A fourth transistor T4 includes a first electrode connected to the gate electrode of the first transistor T1, a second electrode connected to the third driving voltage line VL3 through which the initialization voltage VINT is transmitted, and a gate electrode connected to the initialization scan line SILj. The fourth transistor T4 may be turned on in response to the initialization scan signal SIj received through the initialization scan line SILj and transmit the initialization voltage VINT to the gate electrode of the first transistor T1 to perform an initialization operation for initializing the voltage of the gate electrode of the first transistor T1.

The fifth transistor T5 includes a first electrode connected to the first driving voltage line VL1, a second electrode connected to the first electrode of the first transistor T1, and a gate electrode connected to the light emission control line EMLj.

The sixth transistor T6 includes a first electrode connected to the second electrode of the first transistor T1, a second electrode connected the anode of the light emitting diode ED, and a gate electrode connected to the light emission control line EMLj.

The fifth transistor T5 and the sixth transistor T6 are simultaneously turned on in response the light emission control signal EMj transmitted through the light emission control line EMLj. Amount of current flowing through the first transistor and supplied to the light emitting diode ED is determined according to a voltage charged in the capacitor Cst.

A seventh transistor T7 includes a first electrode connected to the second electrode of the fourth transistor T4, a second electrode connected to the second electrode of the sixth transistor T6, and a gate electrode connected to the second write scan line SWLj+1.

The one end of the capacitor Cst is connected to the gate electrode of the first transistor T1 as described above and the other end thereof is connected to the first driving voltage line VL1. A cathode of the light emitting diode ED may be connected to the second driving power line VL2 which transmits the second driving voltage ELVSS.

When the initialization scan signal SIj of a high level is supplied through the initialization scan line SILj, the fourth transistor T4 is turned on in response to the initialization scan signal SIj of a high level. The initialization voltage VINT is transmitted to the gate electrode of the first transistor T1 through the turned-on fourth transistor T4 and the first transistor T1 is initialized through the initialization voltage VINT.

Next, when the compensation scan signal SCj of a high level is supplied through the compensation scan line SCLj, the third transistor T3 is turned on. The first transistor T1 is diode-connected by the turned-on third transistor T3 and is biased in a forward direction. In addition, the second transistor T2 is turned on by the first write scan signal SWj. Then, a compensation voltage "Di-Vth" which is a voltage reduced by a threshold voltage Vth of the first transistor T1 from the data signal Di supplied from the data line DLi is applied to the gate electrode of the first transistor T1. That is, the potential of the gate electrode of the first transistor T1 may be the compensation voltage "Di-Vth."

To both ends of the capacitor Cst, the first driving voltage ELVDD and the compensation voltage "Di-Vth" are applied, and electric charges corresponding to the voltage difference between both ends of the capacitor Cst may be stored in the capacitor Cst.

Meanwhile, the seventh transistor T7 is turned on by the second write scan signal SWj+1 of a low level which is supplied from the second write scan line SWL+1. A portion of the driving current Id may flow through the seventh transistor T7 as a bypass current Ibp.

If the light emitting diode ED emits light even when the pixel PXij displays a black image due to a leakage current of the first transistor T1, the black image is not properly displayed. Accordingly, the seventh transistor T7 in the pixel PXij according to an embodiment of the inventive concept may direct a portion of the leakage current of the first transistor T1 as the bypass current Ibp to a current path other than a current path via the light emitting diode ED. Here, the leakage current of the first transistor T1 refers to a current under a condition that the first transistor is turned off since a gate-source voltage Vgs of the first transistor T1 is less than the threshold voltage Vth. As such, a leakage current under the condition that the first transistor T1 is turned off (for example, a current of 10 pA or less) flows through the light emitting diode ED and displayed as an image of black luminance. When displaying a black image, the influence of the bypass transmission of the bypass current Ibp is significant. However, when displaying an image having a luminance greater than the black image, such as a normal image or a white image, there is little influence of the bypass current Ibp. Accordingly, when displaying a black image, a light emitting current Ied of the light emitting diode ED is reduced by the amount of current of the bypass current Ibp, thus the pixel PXij may display a black image close to a real black image. Accordingly, an image of accurate black luminance may be implemented using the seventh transistor T7 to improve a contrast ratio.

Next, the light emission control signal EMj supplied from the light emission control line EMLj is changed from a high level to a low level. The fifth transistor T5 and the sixth transistor T6 are turned on by the light emission control signal EMj of a low level. Then, the driving current Id corresponding to the voltage difference between the gate voltage of the gate electrode of the first transistor T1 and the first driving voltage ELVDD is generated, and the driving current Id is supplied to the light emitting diode ED through the sixth transistor T6, and allow the current Ied to flow through the light emitting diode ED.

Figure 6A:
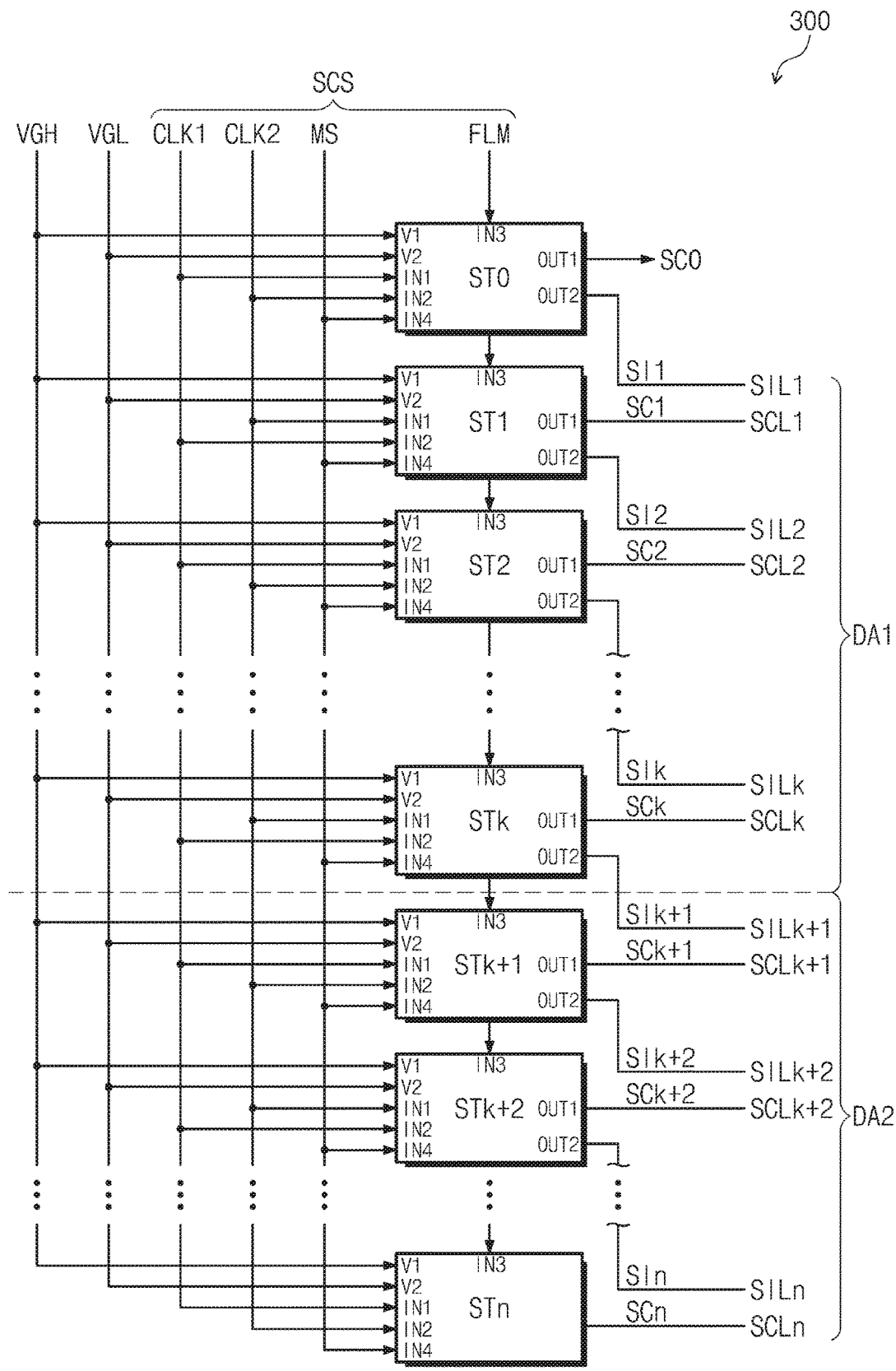
FIG. 6A is a block diagram of a scan driver according to an embodiment of the inventive concept.
Figure 6B:
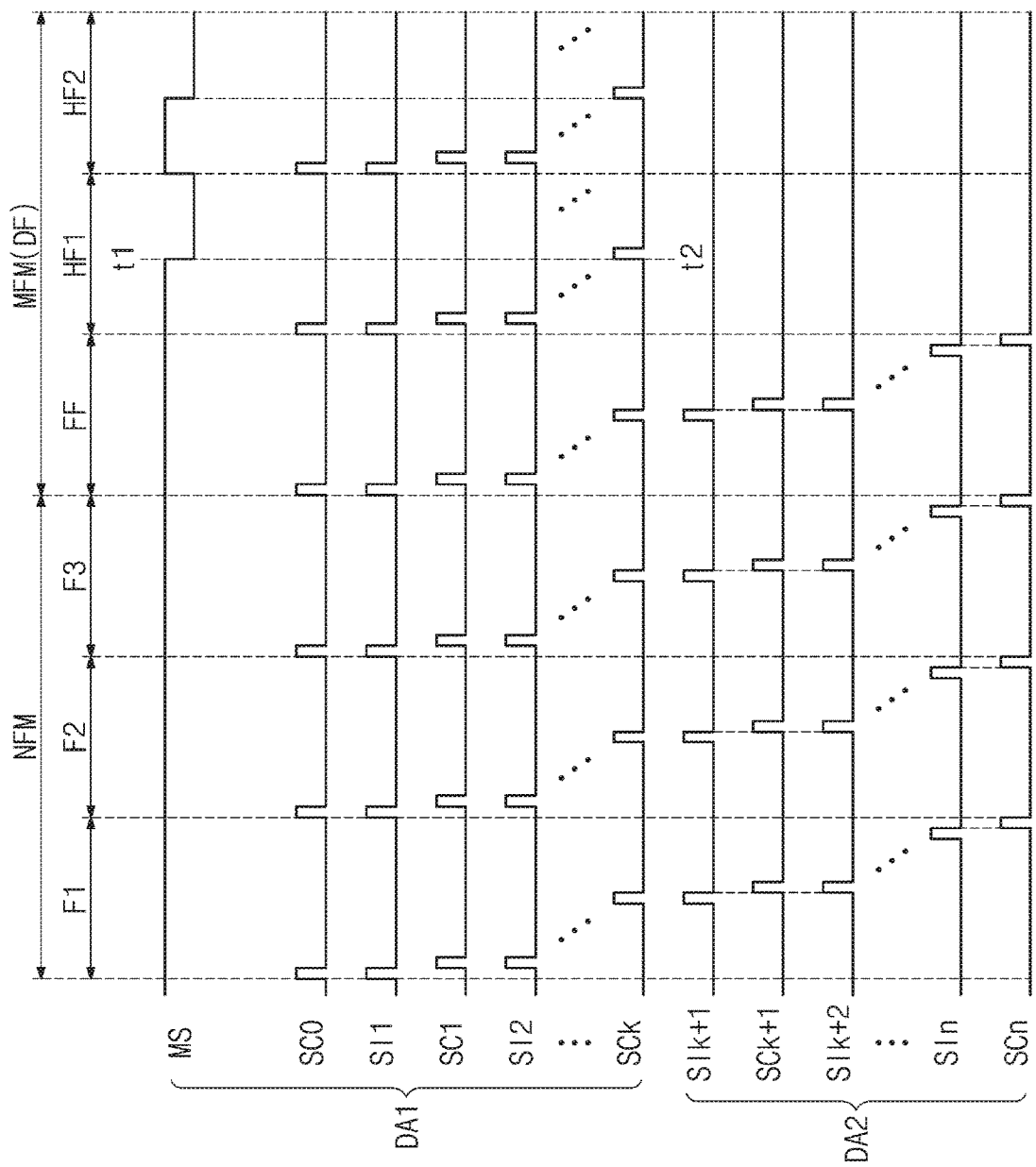
FIG. 6B is a waveform diagram of initialization scan signals and compensation scan signals which are output from a scan driver in a normal frequency mode and in a multi-frequency mode.

FIG. 6A is a block diagram of a scan driver according to an embodiment of the inventive concept, and FIG. 6B is a waveform diagram of initialization scan signals and compensation scan signals which are output from a scan driver in a normal frequency mode and in a multi-frequency mode.

Referring to FIG. 6A, the scan driver 300 includes driving stages ST0 to STn. Each of the driving stages ST0 to STn receives the scan control signal SCS from the driving controller 100 illustrated in FIG. 4. The scan control signal SCS includes a start signal FLM, a first clock signal CLK1, a second clock signal CLK2, and a masking signal MS. Each of the driving stages ST0 to STn further receives a first voltage VGH and a second voltage VGL. The first voltage VGH and the second voltage VGL may be provided from the voltage generator 400 illustrated in FIG. 4.

The masking signal MS may be a signal for masking scan signals (for example, initialization scan signals) supplied to the second display region DA2 to a predetermined level. As an example of the inventive concept, the masking signal MS may be provided to each of the driving stages ST0 to STn.

In an embodiment, each of the driving stages ST0 to STn may be provided with a first output terminal OUT1 which outputs a corresponding compensation scan signal and a second output terminal OUT2 which outputs a corresponding initialization scan signal.

To the first output terminal OUT1 of each of driving stages ST1 to STn among the driving stages ST0 to STn, a corresponding compensation scan line is connected. Compensation scan signals SC1 to SCn among compensation scan signals SC0 to SCn are respectively provided to the compensation scan lines SCL1 to SCLn. Specifically, the first output terminal OUT1 of a first driving stage ST1 among the driving stages ST1 to STn is connected to the corresponding first compensation scan line SCL1, thereby supplying a first compensation scan signal SC1 to the first compensation scan line SCL1.

To the second output terminal OUT2 of each of driving stages ST0 to STn−1 among the driving stages ST0 to STn, a corresponding initialization scan line may be connected. Initialization scan signals SI1 to SIn output from the second output terminal OUT2 of the driving stages ST0 to STn−1 are respectively provided to initialization scan lines SIL1 to SILn. Specifically, the second output terminal OUT2 of a dummy driving stage ST0 among the driving stages ST0 to STn is connected to the corresponding first initialization scan line SILL thereby supplying a first initialization scan signal SI1 to the first initialization scan line SILL Also, the second output terminal OUT2 of the first driving stage ST1 among the driving stages ST0 to STn−1 is connected to the corresponding second initialization scan line SIL2, thereby supplying a second initialization scan signal S12 to the second initialization scan line SIL2.

Here, first to k-th initialization scan lines SIL1 to SILk among n initialization scan lines SIL1 to SILn are disposed in the first display region DA1, and (k+1)-th to n-th initialization scan lines SILk+1 to SILn among the n initialization scan lines SIL1 to SILn are disposed in the second display region DA2. Here, n and k are integers greater than or equal to 1, and n is greater than k. Here, first to k-th compensation scan lines SCL1 to SILk among n compensation scan lines SCL1 to SCLn are disposed in the first display region DA1, and (k+1)-th to n-th compensation scan lines SCLk+1 to SCLn among the n compensation scan lines SCL1 to SCLn are disposed in the second display region DA2.

In FIG. 6A, the write scan lines SWL1 to SWLn illustrated in FIG. 4 are not illustrated. The driving stages ST1 to STn may be connected to corresponding write scan lines, but the inventive concept is not limited thereto. That is, the scan driver 300 may further include driving stages for providing write scan signals to the write scan lines SWL1 to SWLn other than the driving stages ST1 to STn.

The dummy driving stage ST0 among the driving stages ST0 to STn may receive the start signal FLM as a carry signal. Each of the driving stages ST1 to STn receives a carry signal from a previous driving stage. For example, the first driving stage ST1 receives a carry signal from the dummy driving stage ST0, and a second driving stage ST2 receives a carry signal from the first driving stage ST1. As an example of the inventive concept, the carry signal input to the first driving stage ST1 may be the first initialization scan signal SI1 output from the dummy driving stage ST0, the carry signal input to the second driving stage ST2 may be the second initialization scan signal SI2 output from the first driving stage ST1. That is, first to n-th driving stages ST1 to STn among the driving stages ST0 to STn may receive an initialization scan signal output from an immediately preceding driving stage as the carry signal. However the embodiment of the inventive concept is not limited thereto. In an embodiment, each of the driving stages ST1 to STn may receive an initialization scan signal output from any one driving stage among previous driving stages as the carry signal.

Referring to FIG. 6A and FIG. 6B, in the normal frequency mode NFM, the masking signal MS is maintained at a first level (for example, a high level). Here, the first level may be the same as the level of the first voltage VGH.

The scan driver 300 may output the compensation scan signals SC1 to SCn sequentially activated during each frame F1, F2, and F3 in the normal frequency mode NFM and the initialization scan signals SI1 to SIn sequentially activated during each frame F1, F2, and F3 in the normal frequency mode NFM. As an example of the inventive concept, each of the compensation scan signals SC1 to SCn may have a high level during an active period and may have a low level during an inactive period. In addition, each of the initialization scan signals SI1 to SIn may have a high level during an active period and may have a low level during an inactive period. Optionally, when the third transistor T3 and the fourth transistor T4 are PMOS transistors, each of the compensation scan signals SC1 to SCn may have a low level during an active period and may have a high level during an inactive period. In addition, when the third transistor T3 and the fourth transistor T4 are PMOS transistors, each of the initialization scan signals SI1 to SIn may have a low level during an active period and may have a high level during an inactive period.

For convenience of description, a mode in which each of the compensation scan signals SC1 to SCn and each of the initialization scan signals SI1 to SIn have a high level during an active period and have a low level during an inactive period is defined as a normally low mode. On the contrary, a mode in which each of the compensation scan signals SC1 to SCn and each of the initialization scan signals SI1 to SIn have a low level during an active period and have a high level during an inactive period is defined as a normally high mode. Hereinafter, in FIG. 6A to FIG. 7D, an operation in the normally low mode will be described, and in FIG. 8A and FIG. 8B, an operation in the normally high mode will be described.

In the multi-frequency mode MFM, the driving frame DF includes the full frame FF and partial frames HF1 and HF2. FIG. 6B illustrates only 2 partial frames HF1 and HF2 included in the driving frame DF. However, the number of partial frames HF1 and HF2 included in the driving frame DF may vary depending on a driving frequency of the first display region DA1.

In the multi-frequency mode MFM, the masking signal MS may be maintained at the first level during the full frame FF. That is, the masking signal MS may be maintained at the first level during the full frame FF as in the normal frequency mode NFM.

In the multi-frequency mode MFM, when the full frame FF is ended and a first partial frame HF1 is initiated, the masking signal MS may be changed from the first level to a second level (for example, a low level) in synchronization with the start point of the second display region DA2 which is driven at a low frequency. Here, the second level may be the same as the level of the second voltage VGL.

When the second display region DA2 starts from a pixel row connected to a (k+1)-th initialization scan line SILk+1 and to a (k+1)-th compensation scan line SCLk+1, the masking signal MS may be changed from the first level to the second level before the active period of a k-th compensation scan signal SCk. That is, a point of time t1 when the masking signal MS is changed from the first level to the second level may coincide with or precede an activation point of time t2 of the k-th compensation scan signal SCk.

As illustrated in FIG. 6B, in the normally low mode, the first level of the masking signal MS may be a high level, and the second level thereof may be a low level which is lower than the first level. However, in the normally high mode, the first level of the masking signal MS may be a low level, and the second level thereof may be a high level which is higher than the first level.

By the masking signal MS, a (k+1)-th initialization scan signal SIk+1 output from a k-th driving stage STk may be masked. That is, the k-th compensation scan signal SCk output from the first output terminal OUT1 of the k-th driving stage STk is activated, whereas the (k+1)-th initialization scan signal SIk+1 output from the second output terminal OUT2 of the k-th driving stage STk is not activated by the masking signal MS. In addition, a (k+1)-th driving stage STk+1 which receives the (k+1)-th initialization scan signal SIk+1 maintained in an inactive state as a carry signal cannot activate a (k+2)-th initialization scan signal SIk+2 and a k+1 compensation scan signal SCk+1. Therefore, during the first partial frame HF1, the initialization scan lines SILk+1 to SILn and the compensation scan lines SCLk+1 to SCLn disposed in the second display region DA2 are maintained in an inactive state.

The masking signal MS may be maintained at the second level before a next partial frame HF2 (that is, a second partial frame) starts. When the second partial frame HF2 starts, the masking signal MS is changed to the first level. The masking signal MS may be changed from the first level to the second level in synchronization with the start point of the second display region DA in the second partial frame HF2.

During each partial frame HF1 and HF2, the level of the masking signal MS is changed in synchronization with the start point of the second display region DA2, so that the initialization scan lines SILk+1 to SILn and the compensation scan lines SCLk+1 to SCLn disposed in the second display region DA2 may be maintained in an inactive state. Depending on the size of the second display region DA2, the width of a section in which the masking signal MS has the second level (that is, a second level section) may vary. That is, if the percentage of the second display region DA2 in the display region DA increases, the percentage of the second level section of the masking signal MS in each partial frame HF1 and HF2 may also increase.

Figure 7A:
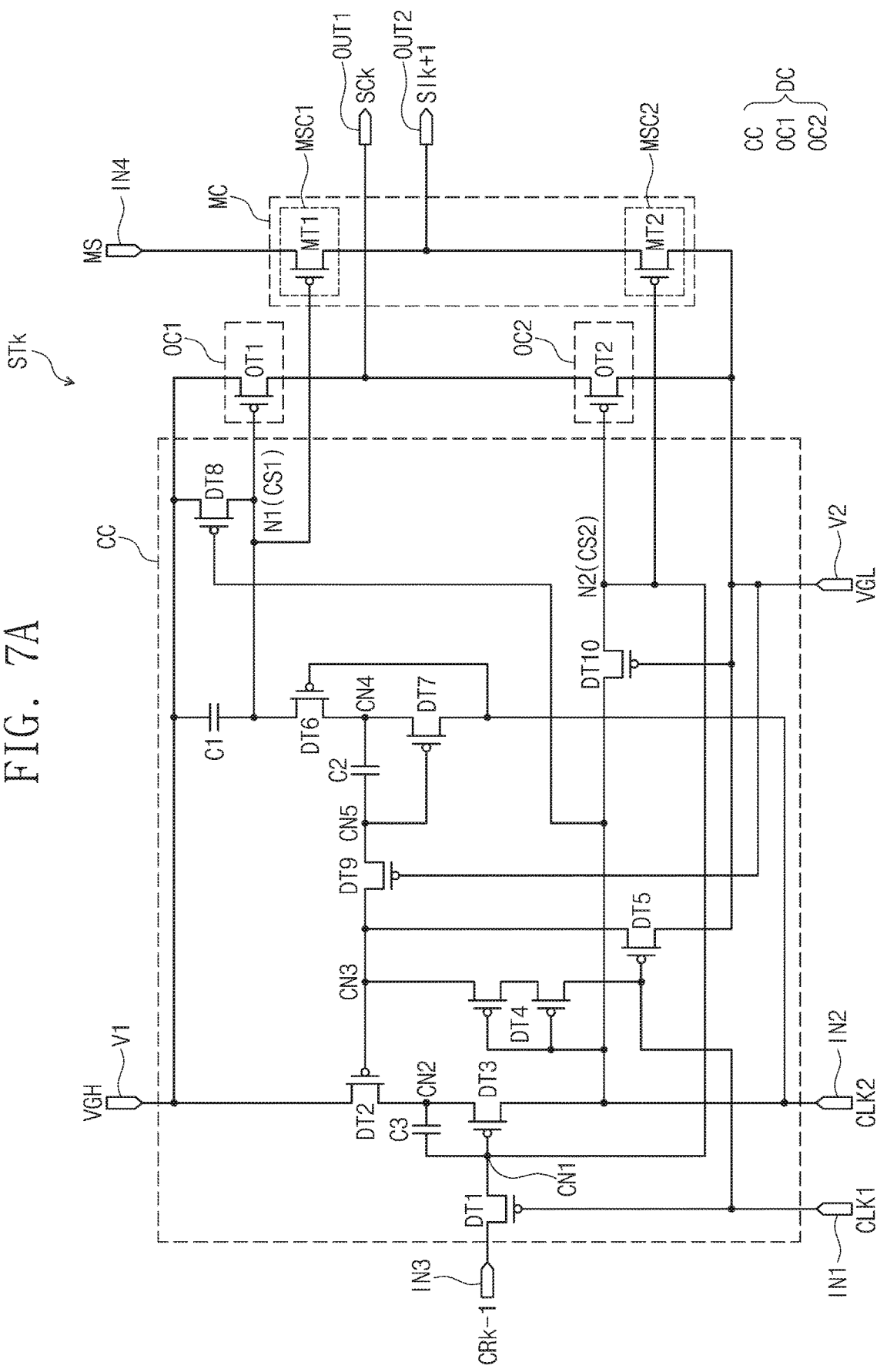
FIG. 7A is a circuit diagram showing a k-th driving stage among driving stages according to an embodiment of the inventive concept.

As such, the masking signal MS may mask initialization scan signals SIk+1 to SIn output from some driving stages connected to the initialization scan lines SILk+1 to SILn of the second display region DA2 among the driving stages ST0 to STn in an inactive state in the multi-frequency mode MFM. FIG. 7A illustrates one driving stage STk (that is, the k-th driving stage) among driving stages STk to STn to which the masking signal MS is provided.

Each of the driving stages ST0 to STn illustrated in FIG. 6A may include the same circuit configuration as the k-th driving stage STk. Hereinafter, the k-th driving stage STk will be described in detail, and descriptions of the other driving stages will be omitted. For convenience of description, the k-th driving stage STk will be referred to as a driving stage STk.

Figure 7B:
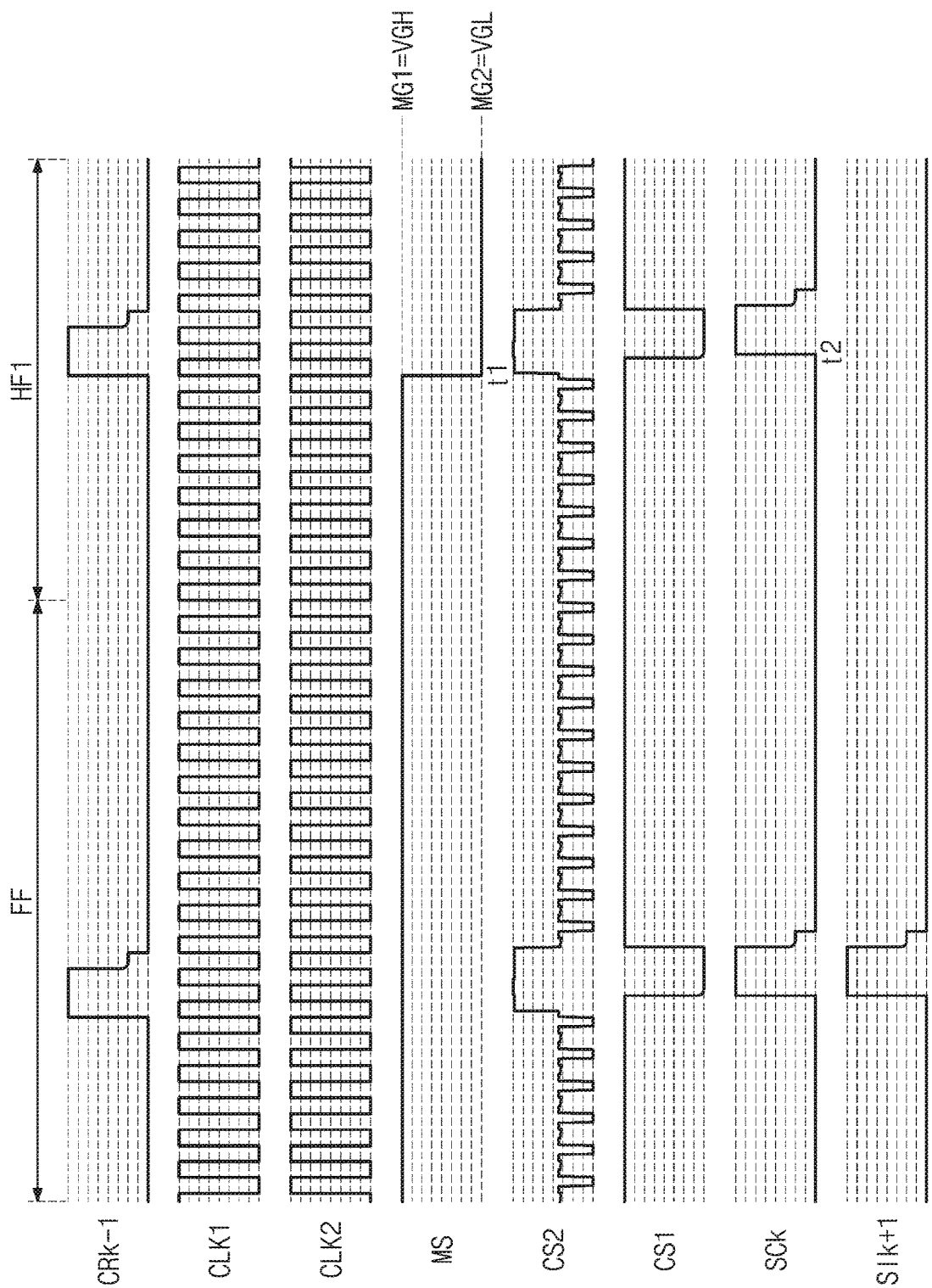
Figure 7D:
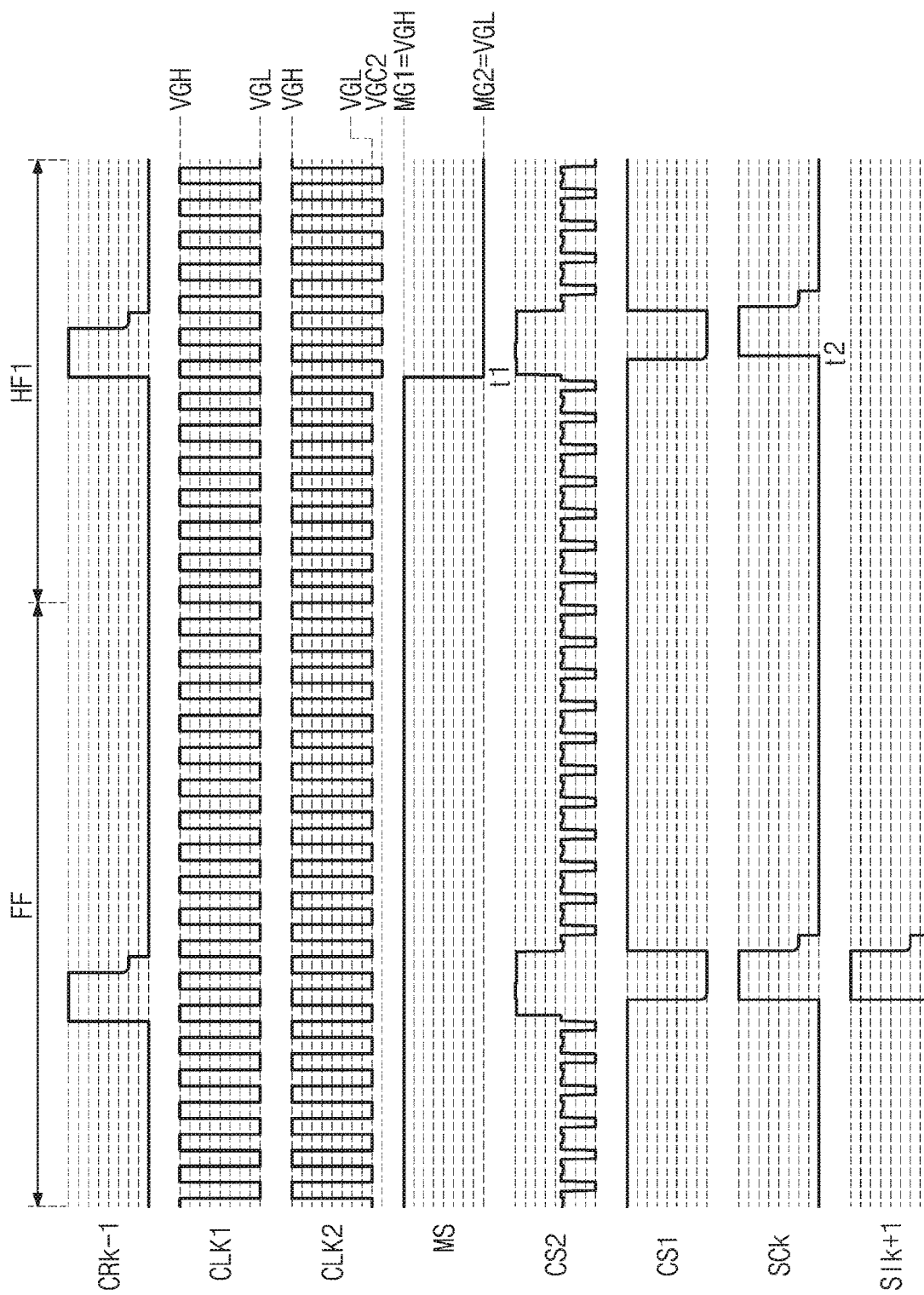

FIG. 7A is a circuit diagram showing the k-th driving stage among driving stages according to an embodiment of the inventive concept, and FIG. 7B to FIG. 7D are waveform diagrams showing a masking signal, first and second clock signals, an initialization scan signal, and a compensation scan signal which are illustrated in FIG. 7A.

Referring to FIG. 7A, the driving stage STk includes a driving circuit DC, a masking circuit MC, first to fifth input terminals IN1, IN2, IN3 and IN4, first and second voltage terminals V1 and V2, and the first and second output terminals OUT1 and OUT2.

The driving circuit DC includes a control circuit CC, a first output circuit OC1, and a second output circuit OC2. The control circuit CC may output a first control signal CS1 and a second control signal CS2 in response to the clock signals CLK1 and CLK2 and a carry signal CRk−1. The first output circuit OC1 is connected between the first output terminal OUT1 and a first voltage terminal V1 and operates in response to the first control signal CS1. The second output circuit OC2 is connected between the first output terminal OUT1 and a second voltage terminal V2 and operates in response to the second control signal CS2. The driving stage STk outputs the k-th compensation scan signal SCk through the first output terminal OUT1. As an example of the inventive concept, the first voltage VGH is applied to the first voltage terminal V1, and the second voltage VGL is applied to the second voltage terminal V2. Here, the second voltage VGL may have a lower voltage level than the first voltage VGH. Therefore, the k-th compensation scan signal SCk may have the same voltage level as the first voltage VGL during an active period and may have the same voltage level as the second voltage VGL during an inactive period.

The control circuit CC includes driving transistors DT1 to DT10 and driving capacitors C1 to C3. The control circuit CC receives the first clock signal CLK1, the second clock signal CKL2, and the carry signal CRk−1 respectively through first to third input terminals IN1 to IN3. The control circuit CC receives the first voltage VGH and the second voltage VGL respectively through the first voltage terminal V1 and the second voltage terminal V2. The carry signal CRk−1 which is received through a third input terminal IN3 may be the k-th initialization scan signal SIk (see FIG. 6A) output from a previous driving stage.

A first input terminal IN1 of each of some driving stages (e.g., odd-numbered driving stages) among the driving stages ST0 to STn illustrated in FIG. 6A receives the first clock signal CLK1, and a second input terminal IN2 thereof receives the second clock signal CLK2. In addition, the first input terminal IN1 of each of some driving stages (e.g., even-numbered driving stages) among driving stages ST0 to STn receives the second scan clock signal CLK2, and the second input terminal IN2 receives the first clock signal CLK1.

A first driving transistor DT1 is connected between the third input terminal IN3 and a first control node CN1 and includes a gate electrode connected to the first input terminal IN1. A second driving transistor DT2 is connected between the first voltage terminal V1 and a second control node CN2 and includes the gate electrode connected to a third control node CN3. A third driving transistor DT3 is connected between the second control node CN2 and the second input terminal IN2 and includes a gate electrode connected to the first control node CN1.

A fourth driving transistor DT4 is connected between a third control node CN3 and the first input terminal IN1 and includes a gate electrode connected to the second input terminal IN2. As an example of the inventive concept, the fourth driving transistor DT4 may include a plurality fourth driving transistors DT4, and the plurality of fourth transistors DT4 may be connected in series between the third control node CN3 and the first input terminal IN1. A fifth driving transistor DT5 is connected between the third control node CN3 and the second voltage terminal V2 and includes a gate electrode connected to the first input terminal IN1. A sixth driving transistor DT6 is connected between the first voltage terminal V1 and a fourth control node CN4 and includes a gate electrode connected to a second input terminal IN2. A seventh driving transistor DT7 is connected between the fourth control node CN4 and the second input terminal IN2 and includes a gate electrode connected to the fifth control node CN5.

A first driving capacitor C1 is connected between a first node N1 and the first voltage terminal V1. A second driving capacitor C2 is connected between the fourth control node CN4 and the fifth control node CN5. A third driving capacitor C3 is connected between the first control node CN1 and the second driving transistor DT2.

An eighth driving transistor DT8 is connected between the first voltage terminal V1 and the first node N1 and includes a gate electrode connected to the second input terminal IN2. A ninth driving transistor DT9 is connected between the third control node CN3 and the fifth control node CN5 and includes a gate electrode connected to the second voltage terminal V2. A tenth driving transistor DT10 is connected between the second input terminal IN2 and a second node N2 and includes a gate electrode connected to the second voltage terminal V2.

In response to the carry signal CRk−1 and the first and second clock signals CLK1 and CLK2, the control circuit CC outputs the first control signal CS1 for controlling the first output circuit OC1 through the first node N1 and outputs the second control signal CS2 for controlling the second output circuit OC2 through the second node N2. FIG. 7A illustrates a structure in which the control circuit CC includes 10 driving transistors DT1 to DT10 and two driving capacitors C1 and C2 but the circuit configuration of the control circuit CC is not limited thereto. That is, the number and connection relationship of driving transistors and driving capacitors included in the control circuit CC may be variously modified.

The first output circuit OC1 includes a first output transistor OT1 and the second output circuit OC2 includes a second output transistor OT2. The first output transistor OT1 is connected between the first voltage terminal V1 and the first output terminal OUT1 and includes a gate electrode connected to the first node N1. The second output transistor OT2 is connected between the second voltage terminal V2 and the first output terminal OUT1 and includes a gate electrode connected to the second node N2.

Referring to FIG. 7A and FIG. 7B, the first output circuit OC1 operates in response to the first control signal CS1. The first output transistor OT1 is turned on during an active period of the first control signal CS1, and the first voltage VGH is supplied to the first output terminal OUT1 through the turned-on first output transistor OT1 so that the k-th compensation scan signal SCk is activated with the first voltage VGH. The second output circuit OC2 operates in response to the second control signal CS2. The second control signal CS2 is activated during an inactive period of the first control signal CS1 and turns on the second output transistor OT2. The second voltage VGL is provided to the first output terminal OUT1 through the turned-on second output transistor OT2 so that the k-th compensation scan signal SCk is deactivated with the second voltage VGL. In FIG. 7B, the k-th compensation scan signal SCk operates in the normally low mode. As an example of the inventive concept, each of the first and second output transistors OT1 and OT2 includes a PMOS transistor. Thus, each of the first and second control signals CS1 and CS2 may have a low level (for example, a voltage level the same as the second voltage VGL) during an active period, and may have a high level (for example, a voltage level same as the first voltage VGH) during an inactive period.

Referring to FIG. 6A, FIG. 6B, FIG. 7A, and FIG. 7B, the masking circuit MC includes a first masking circuit MSC1 and a second masking circuit MSC2. The first masking circuit MSC1 includes a first masking transistor MT1 and the second masking circuit MSC2 includes a second masking transistor MT2. The first masking transistor MT1 is connected between the fourth input terminal IN4 and the second output terminal OUT2 and includes a gate electrode connected to the first node N1. The second masking transistor MT2 is connected between the second output terminal OUT2 and the second voltage terminal V2 and includes a gate electrode connected to the second node N2. The first control signal CS1 output through the first node N1 of the control circuit CC is provided to the first masking circuit MSC1 and the second control signal CS2 output through the second node N2 of the control circuit CC is provided to the second masking circuit MSC2.

According to the inventive concept, the first and second masking circuits MSC1 and MSC2 are not connected directly to the first output terminal OUT1. Therefore, even when the masking circuit MC is added to the driving stage STk, the k-th compensation scan signal SCk and the (k+1)-th initialization scan signal SIk+1 may be stably output from the first and second output terminals OUT1 and OUT2.

According to the inventive concept, the first and second masking circuits MSC1 and MSC2 are supplied with the first and second control signals CS1 and CS2 directly from the control circuit CC, not via the first output terminal OUT1. Therefore, compared to a structure in which the first and second masking circuits MSC1 and MSC2 are connected directly to the first output terminal OUT1, the size of each of the masking circuit MC and the first and second output circuits OC1 and OC2 may be reduced.

The first masking circuit MSC1 stops (or masks) the output of the (k+1)-th initialization scan signal SIk+1 in response to the first control signal CS1. The first masking circuit MSC1 operates in response to the first control signal CS1 in the same way as the first output circuit OC1. Thus, the first masking circuit MSC1 may be turned on simultaneously with the first output circuit OC1. Specifically, during the active period of the first control signal CS1, the first masking transistor MT1 is turned on and the masking signal MS is applied to the second output terminal OUT2 through the turned-on first masking transistor MT1. When the masking signal MS has a first level MG1, the (k+1)-th initialization scan signal SIk+1 activated to the first level MG1 may be output to the second output terminal OUT2. The masking signal MS has the first level MG1 and is deactivated during the full frame FF so that the (k+1)-th initialization scan signal SIk+1 may be activated simultaneously with the k-th compensation scan signal SCk in the full frame FF.

From the beginning of each partial frames HF1 and HF2 to a first point of time t1, the masking signal MS may be maintained at the first level MG1. At the first point of time t1, the masking signal MS may be changed from the first level MG1 to a second level MG2. That is, the masking signal MS may be inactivated during a period in which the first display region DA1 is driven and may be activated during a period in which the second display region DA2 is driven in each partial frame HF1 and HF2. When the second display region DA2 is a region in which the k+1-th initialization scan line SILk+1 to an n-th initialization scan line SILn are disposed, the masking signal MS may be changed from the first level MG1 to the second level MG2 before a point of time t2 (hereinafter, a second point of time) at which the k-th compensation scan signal SCk is activated. The first point of time t1 may be the same as the second point of time t2 or may precede the second point of time t2 in time.

When the masking signal MS has the second level MG2, even when the masking signal MS is applied to the second output terminal OUT2 through the turned-on first masking transistor MT1, the (k+1)-th initialization scan signal SIk+1 may not be activated. As an example of the inventive concept, the first level MG1 of the masking signal MS may be the same as the level of the first voltage VGH and the second level MG2 may be the same as the level of the second voltage VGL. Therefore, in an active period in which the masking signal MS is maintained at the second level MG2, even when the masking signal MS is applied to the second output terminal OUT2 through the turned-on first masking transistor MT1, the (k+1)-th initialization scan signal SIk+1 is maintained at the second voltage VGL. That is, even when the first masking circuit MSC1 and the first output circuit OC1 are simultaneously turned on in response to the first control signal CS1, the k-th compensation scan signal SCk output through the first output terminal OUT1 is activated but the (k+1)-th initialization scan signal SIk+1 output through the second output terminal OUT2 is maintained in an inactive state by the masking signal MS having the second level MG2. Therefore, during each partial frame HF1 and HF2, the (k+1)-th initialization scan signal SIk+1 may be masked by the first masking circuit MSC1.

The second masking circuit MSC2 operates in response to the second control signal CS2. Specifically, the second masking transistor MT2 is turned on in an active period of the second control signal CS2 and the (k+1)-th initialization scan signal SIk+1 may be maintained at the second voltage VGL by the turned-on second masking transistor MT2. Particularly, the second control signal CS2 may be activated in an inactive period of the first control signal CS1. Therefore, the second masking circuit MSC2 is turned on during a period in which the first masking circuit MSC1 is turned off, and thus, may maintain the (k+1)-th initialization scan signal SIk+1 in inactive state. Thereafter, when the second control signal CS2 is deactivated and the first control signal CS1 is activated, the first masking circuit MSC1 outputs the masking signal MS to the second output terminal OUT2 in response to the first control signal CS1.

At the first point of time t1 of each partial frame HF1 and HF2, the masking signal MS is changed from the first level MG1 to the second level MG2 so that even when the first masking circuit MSC1 is activated in response to the first control signal CS1, the (k+1)-th initialization scan signal SIk+1 may be maintained in inactive state.

Referring to FIG. 7C, at the first point of time t1, the masking signal MS may be changed front the first level MG1 to the second level MG2. As an example of the inventive concept, the second level MG2 may be a different voltage level from the second voltage VGL. Specifically, the second level MG2 may be the same as the level of a compensation voltage VGC1 higher than the second voltage VGL. For example, when the second VGL is −8 V, the compensation voltage VGC1 may be −6 V. When the potential of the first node N1 connected to a gate electrode of the first masking transistor MT1 is the same as the potential of a source electrode of the first masking transistor MT1, the first and second masking transistors MT1 and MT2 may be turned off simultaneously. Then, the second output terminal OUT2 which is connected to the (k+1)-th initialization scan signal SIk+1 may be in a floating state. When the second level MG2 of the masking signal MS is higher than the level of the second voltage VGL, the potential of the first node N1 connected to the gate electrode of the first masking transistor MT1 becomes lower than the potential of the source electrode of the first masking transistor MT1. In this case, the first masking transistor MT1 may be turned on. Therefore, the first and second masking transistors MT1 and MT2 may not be turned off simultaneously, and as a result, the second output terminal OUT2 which is connected to the (k+1)-th initialization scan signal SIk+1 may be prevented from being in a floating state.

Referring to FIG. 7D, each of the first and second clock signals CKL1 and CLK2 may swing with a high level period having a third level and a low level period having a fourth level. As an example of the inventive concept, the third level may be the same as the level of the first voltage VGH, and the fourth level may be the same as the level of the second voltage VGL.

At the first point of time t1, the masking signal MS may be changed from the first level MG1 to the second level MG2. As an example of the inventive concept, the second level MG2 may be the same as the level of the second voltage VGL. After the first point of time t1, the second clock signal CLK2 which determines the potential of the first node N1 may be lowered to a level corresponding to a second compensation voltage VGC2 during the low level period. That is, if the second clock signal CLK2 has the same voltage level as the second voltage VGL during the low level period before the first point of time t1, the second clock signal CLK2 may have a voltage level corresponding to the second compensation voltage VGC2 which is lower than the second voltage VGL after the first point of time t1. As an example of the inventive concept, the second VGL may be −8 V, and the second compensation voltage VGC2 may be −10 V.

After the first point of time t1, even when the second level MG2 of the masking signal MS is maintained at the second voltage VGL, the potential of the first node N1 becomes lower than the potential of the source electrode of the first masking transistor MT1 by the second clock signal CLK2. In this case, the first masking transistor MT1 may be turned on. Therefore, the first and second masking transistors MT1 and MT2 may not be turned off simultaneously, and as a result, the (k+1)-th initialization scan signal SIk+1 may be prevented from being in a floating state.

Figure 8A:
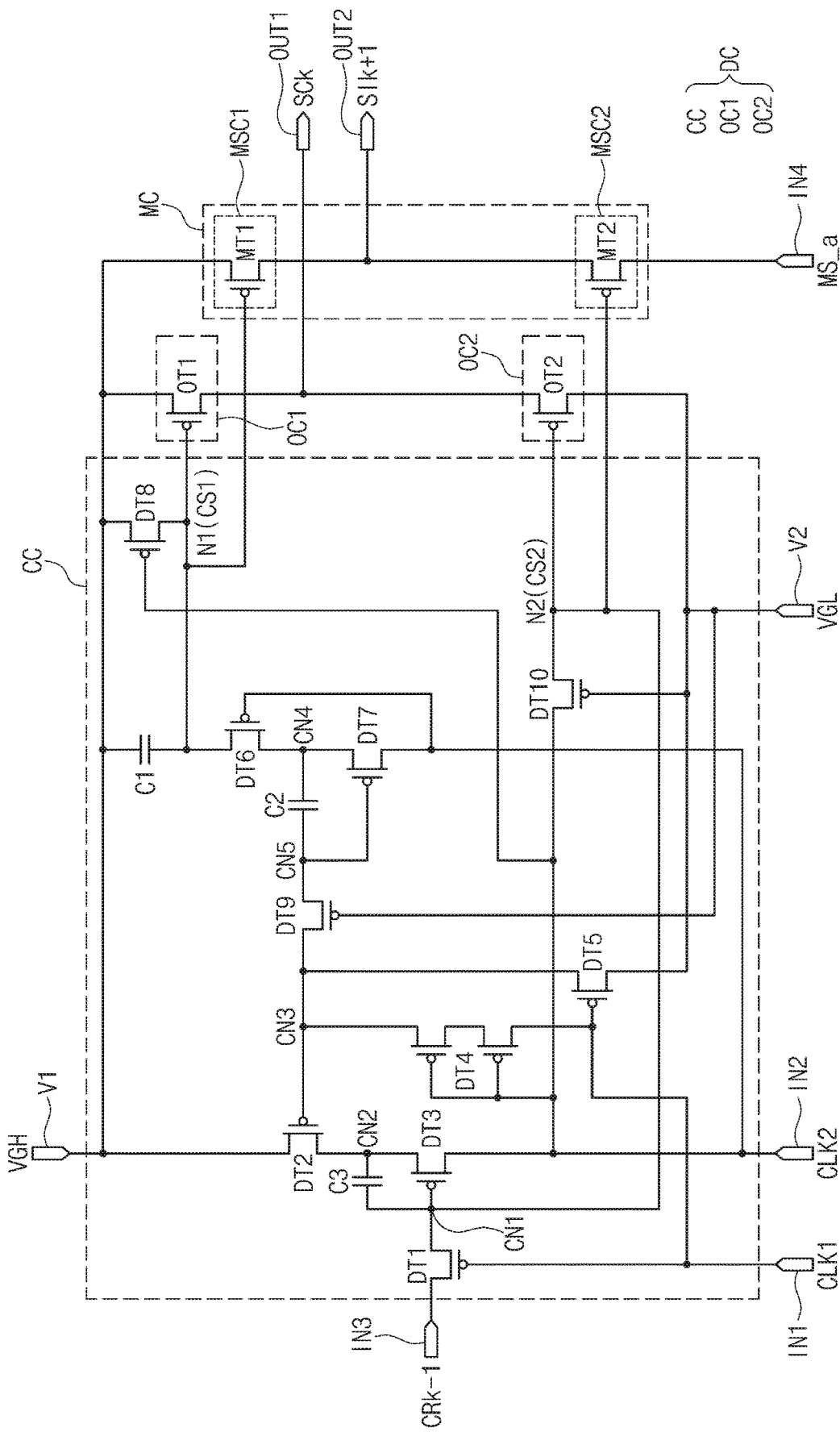
FIG. 8A is a circuit diagram showing a k-th driving stage among driving stages according to an embodiment of the inventive concept.
Figure 8B:
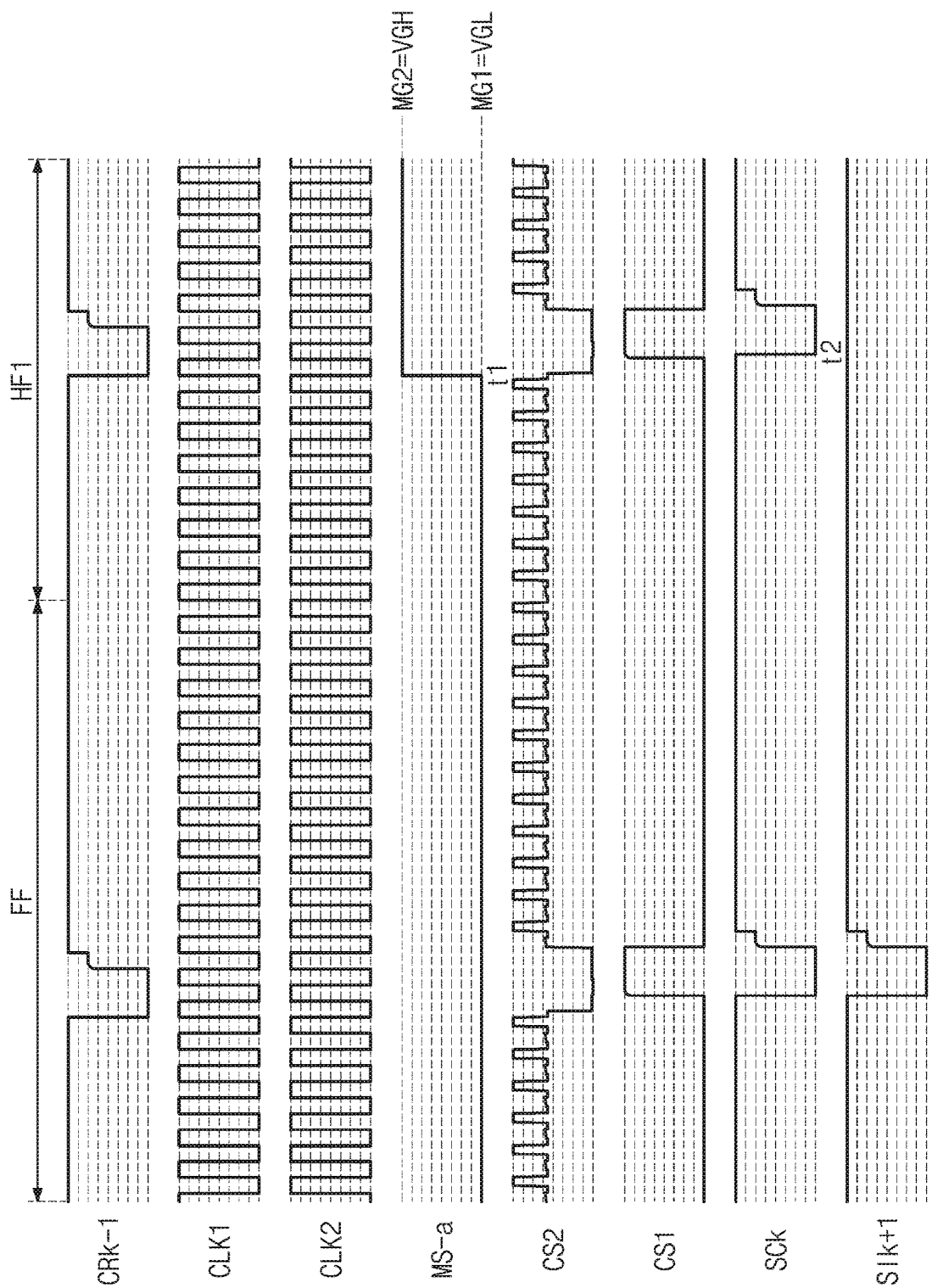
FIG. 8B is a waveform diagram showing a masking signal, first and second clock signals, an initialization scan signal, and a compensation scan signal which are illustrated in FIG. 8A.

FIG. 8A is a circuit diagram showing a k-th driving stage among driving stages according to an embodiment of the inventive concept, and FIG. 8B is a waveform diagram showing a masking signal, first and second clock signals, an initialization scan signal, and a compensation scan signal which are illustrated in FIG. 8A. However, in describing FIG. 8A and FIG. 8B, the same components as those illustrated in FIG. 7A and FIG. 7B are denoted by the same reference numerals, and detailed descriptions of the same components are omitted in order to avoid redundancy.

Referring to FIG. 8A and FIG. 8B, a driving stage STk_a includes a driving circuit DC, a masking circuit MC, first to fourth input terminals IN2, IN3, and IN4, first and second voltage terminals V1 and V2, and the first and second output terminals OUT1 and OUT2.

The driving circuit DC includes a control circuit CC, a first output circuit OC1, and a second output circuit OC2. The control circuit CC may output a first control signal CS1 and a second control signal CS2 in response to the clock signals CLK1 and CLK2 and a carry signal CRk−1. The first output circuit OC1 is connected between the first output terminal OUT1 which outputs the k-th compensation scan signal SCk and a first voltage terminal V1 and operates in response to the first control signal CS1. The second output circuit OC2 is connected between the first output terminal OUT1 and a second voltage terminal V2 and operates in response to the second control signal CS2. As an example of the inventive concept, the first voltage VGH is applied to the first voltage terminal V1 and the second voltage VGL is applied to the second voltage terminal V2. Here, the second voltage VGL may have a lower voltage level than the first voltage VGH. Therefore, the k-th compensation scan signal SCk may have the same voltage level as the second voltage VGL during an active period and may have the same voltage level as the first voltage VGH during an inactive period. In FIG. 8B, the carry signal CRk−1 and the k-th compensation scan signal SCk operate in the normally high mode.

As an example of the inventive concept, each of the first and second output transistors OT1 and OT2 includes a PMOS transistor. Each of the first and second control signals CS1 and CS2 may have a low level (for example, a voltage level same as the second voltage VGL) during an active period and may have a high level (for example, a voltage level same as the first voltage VGH) during an inactive period.

The configuration of each of the control circuit CC, the first output circuit OC1, and the second output circuit OC2 is respectively the same as the configuration of each of the control circuit CC, the first output circuit OC1, and the second output circuit OC2 described above with reference to FIG. 7A, and thus, detailed descriptions thereof are omitted.

Referring to FIG. 8A and FIG. 8B, the masking circuit MC includes a first masking circuit MSC1 and a second masking circuit MSC2. The first masking circuit MSC1 includes a first masking transistor MT1 and the second masking circuit MSC2 includes a second masking transistor MT2. The first masking transistor MT1 is connected between the first voltage terminal V1 and the second output terminal OUT2 and includes a gate electrode connected to the first node N1. The second masking transistor MT2 is connected between the second output terminal OUT2 and a fourth input terminal IN4 and includes a gate electrode connected to the second node N2.

The second masking circuit MSC2 stops (or masks) the output of the (k+1)-th initialization scan signal SIk+1 in response to the second control signal CS2. Specifically, the second masking circuit MSC2 outputs a masking signal MS_a supplied from the fourth input terminal IN4 to the second output terminal OUT2 in response to the second control signal CS2. The second masking circuit MSC2 operates in response to the second control signal CS2 in the same way as the second output circuit OC2, thus the second masking circuit MSC2 may be turned on simultaneously with the second output circuit OC2.

During the full frame FF, the masking signal MS_a may have the first level MG1. As an example of the inventive concept, the first level MG1 may be the same as the level of the second voltage VGL. Therefore, the second masking circuit MSC2 simultaneously turned on with the second output circuit OC2 in response to the second control signal CS2 may output the masking signal MS_a having the first level MG1 to the (k+1)-th initialization scan signal SIk+1. In the full frame FF, the k-th compensation scan signal SCk and the (k+1)-th initialization scan signal SIk+1 which are output from the k-th driving stage STk may be activated simultaneously.

Meanwhile, from the beginning of each partial frames HF1 and HF2 to the first point of time t1, the masking signal MS_a may be maintained at the first level MG1. At the first point of time t1, the masking signal MS_a may be changed from the first level MG1 to the second level MG2. As an example of the inventive concept, the second level MG2 may be the same as the level of the first voltage VGH. That is, even when the second masking circuit MSC2 and the second output circuit OC2 are simultaneously turned on in response to the second control signal CS2, the k-th compensation scan signal SCk output through the first output terminal OUT1 is activated but the (k+1)-th initialization scan signal SIk+1 output through the second output terminal OUT2 is maintained in an inactive state by the masking signal MS_a having the second level MG2. Therefore, during each partial frame HF1 and HF2, the (k+1)-th initialization scan signal SIk+1 may be masked by the second masking circuit MSC2.

The first masking circuit MSC1 operates in response to the first control signal CS1. Specifically, the first masking transistor MT1 is turned on in an active period of the first control signal CS1, and the (k+1)-th initialization scan signal SIk+1 may be maintained at the first voltage VGH by the turned-on first masking transistor MT1. Particularly, the second control signal CS2 may be deactivated in an active period of the first control signal CS1. Therefore, the first masking circuit MSC1 is turned on during a period in which the second masking circuit MSC2 is turned off and thus, the first masking circuit MSC1 may maintain the (k+1)-th initialization scan signal SIk+1 in inactive state. Thereafter, when the first control signal CS1 is deactivated and the second control signal CS2 is activated, the second masking circuit MSC1 outputs the masking signal MS_a to the second output terminal OUT2 in response to the second control signal CS2.

At the first point of time t1 of each partial frame HF1 and HF2, the masking signal MS_a is changed from the first level MG1 to the second level MG2 so that even when the second masking circuit MSC2 is activated in response to the second control signal CS2, the (k+1)-th initialization scan signal SIk+1 may be maintained in inactive state.

Figure 9:
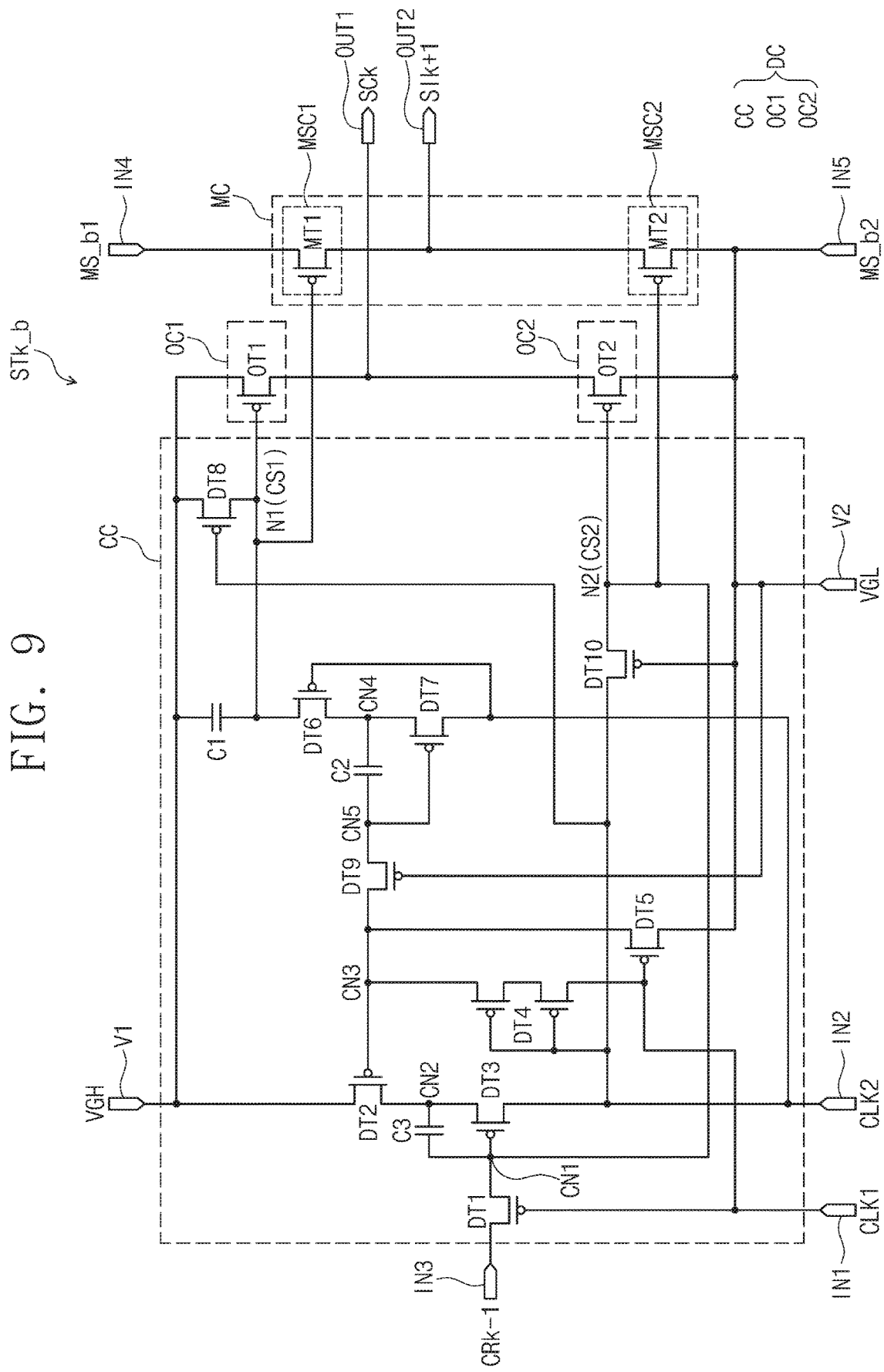
FIG. 9 is a circuit diagram showing a k-th driving stage among driving stages according to an embodiment of the inventive concept.

FIG. 9 is a circuit diagram showing a k-th driving stage among driving stages according to an embodiment of the inventive concept. However, in describing FIG. 9, the same components as those illustrated in FIG. 7A are denoted by the same reference numerals and detailed descriptions of the same components are omitted in order to avoid redundancy.

Referring to FIG. 9, a driving stage STk_b includes a driving circuit DC, a masking circuit MC, first to fifth input terminals IN1, IN2, IN3, IN4, and IN5, first and second voltage terminals V1 and V2, and the first and second output terminals OUT1 and OUT2. The driving stage STk_b may output the k-th compensation scan signal SCk and the (k+1)-th initialization scan signal SIk+1 in the normally low mode or in the normally high mode.

The first voltage VGH is applied to a first voltage terminal V1 and the second voltage VGL is applied to a second voltage terminal V2. Here, the second voltage VGL may have a lower voltage level than the first voltage VGH. In the normally low mode, the k-th compensation scan signal SCk may have the same voltage level as the first voltage VGL during an active period and may have the same voltage level as the second voltage VGL during an inactive period. Meanwhile, in the normally high mode, the k-th compensation scan signal SCk may have the same voltage level as the second voltage VGL during an active period and may have the same voltage level as the first voltage VGH during an inactive period.

The first masking circuit MSC1 includes a first masking transistor MT1 and the second masking circuit MSC2 includes a second masking transistor MT2. The first masking transistor MT1 is connected between a fourth input terminal IN4 and the second output terminal OUT2 and operates in response to the first control signal CS1. The second masking transistor MT2 is connected between the second output terminal OUT2 and a fifth input terminal IN5 and operates in response to the second control signal CS2.

The first masking circuit MSC1 outputs a first masking signal MS_b1 supplied from the fourth input terminal IN4 to the second output terminal OUT2 in response to the first control signal CS1. The second masking circuit MSC2 outputs a second masking signal MS_b2 supplied from the fifth input terminal IN5 to the second output terminal OUT2 in response to the second control signal CS2. As an example of the inventive concept, in the normally low mode, the first level MG1 (see FIG. 7B) of the first masking signal MS_b1 may have the same voltage level as the first voltage VGH and the second level MG2 (see FIG. 7B) of the first masking signal MS_b1 may have the same voltage level as the second voltage VGL. In the normally high mode, the first level MG1 (see FIG. 8B) of the first masking signal MS_b1 may have the same voltage level as the second voltage VGL and the second level MG2 (see FIG. 8B) of the first masking signal MS_b1 may have the same voltage level as the first voltage VGH.

Therefore, the driving stage STk_b in accordance with FIG. 9 may output the k-th compensation scan signal SCk and the (k+1)-th initialization scan signal SIk+1 in the normally low mode or in the normally high mode and may mask the output of the (k+1)-th initialization scan signal SIk+1 in the normally low mode or in the normally high mode.

Figure 10A:
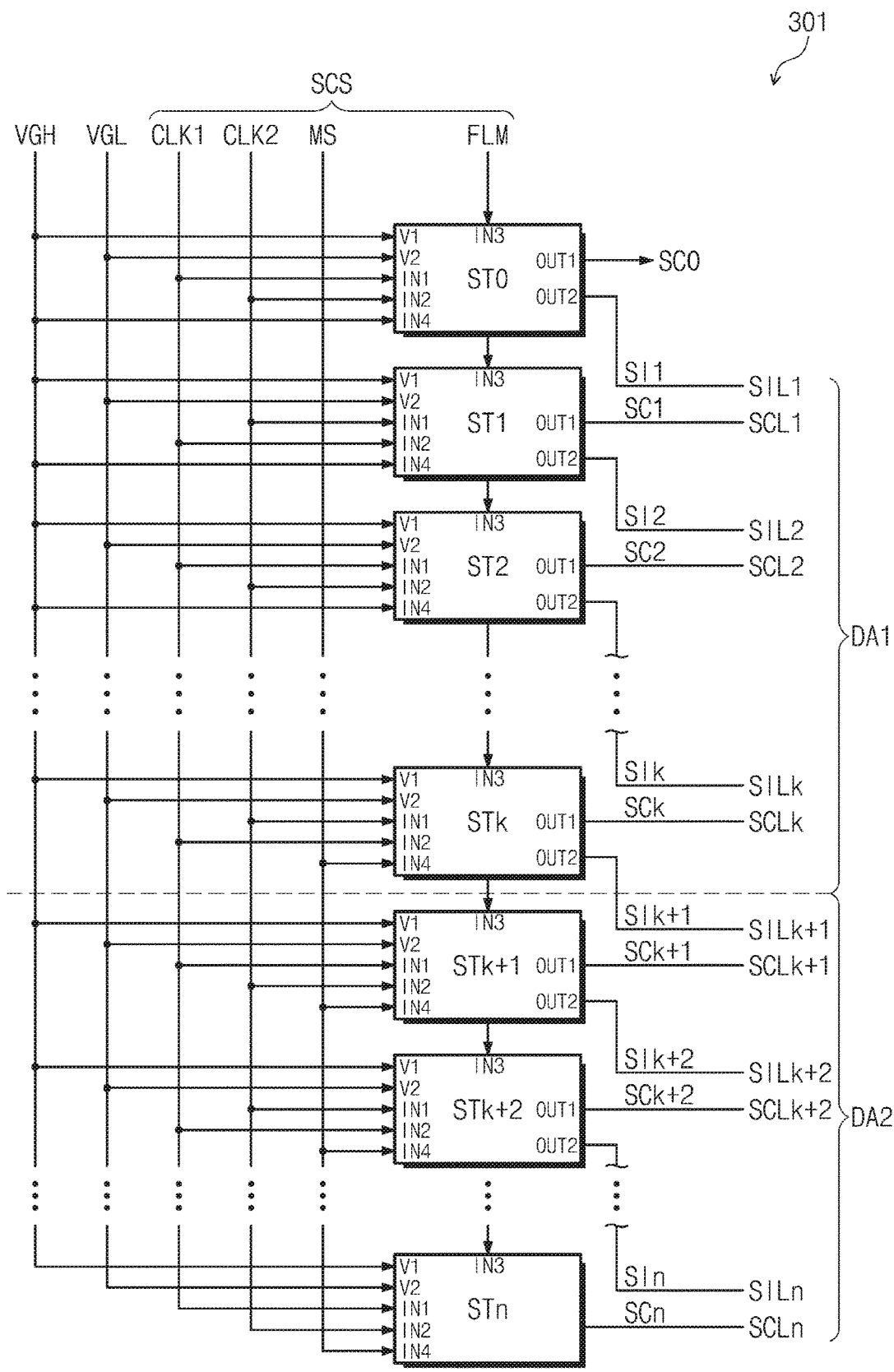
FIG. 10A is a block diagram of a scan driver according to an embodiment of the inventive concept.
Figure 10B:
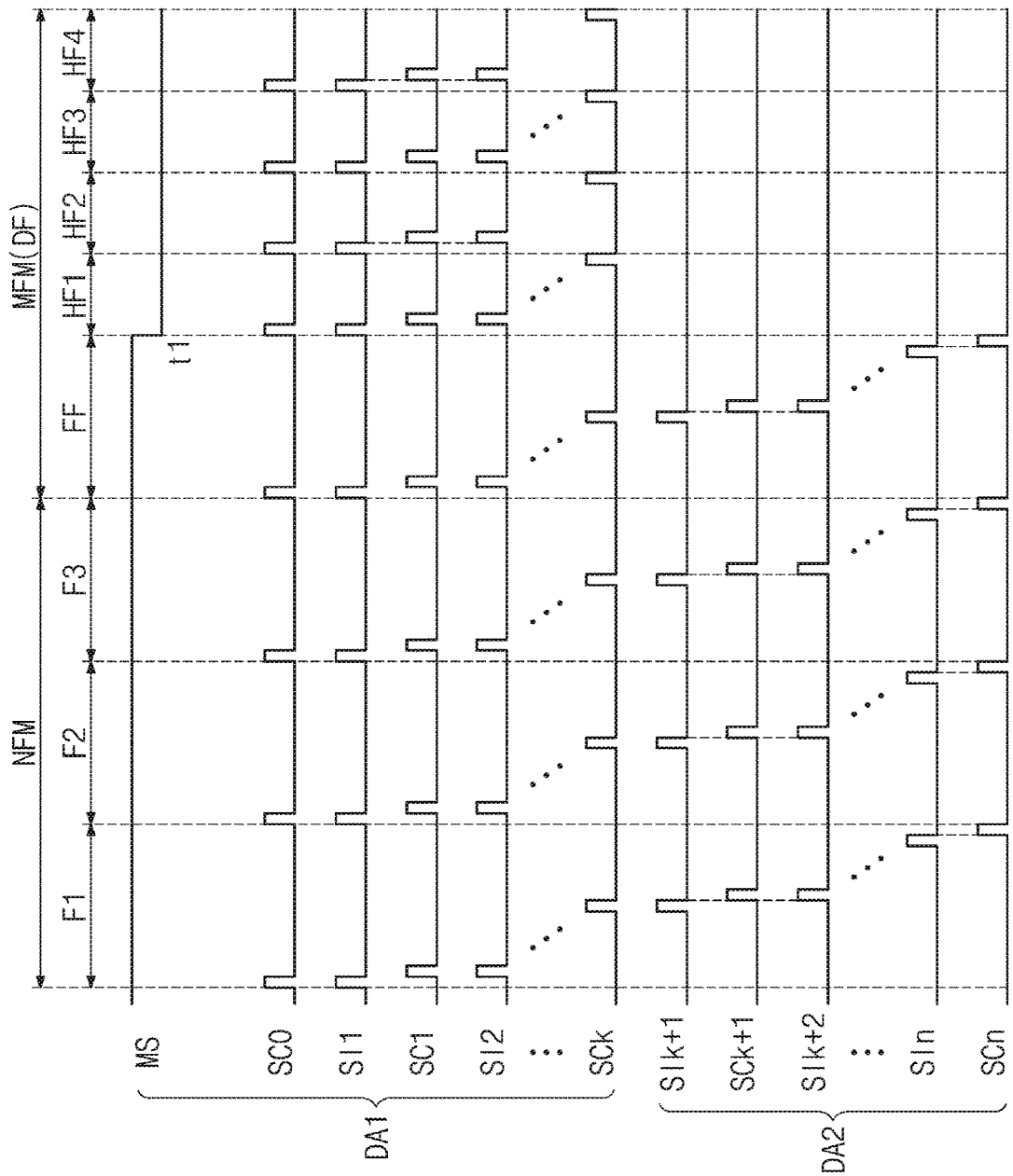
FIG. 10B is a waveform diagram of initialization scan signals and compensation scan signals which are output from a scan driver in a normal frequency mode and in a multi-frequency mode.

FIG. 10A is a block diagram of a scan driver according to an embodiment of the inventive concept, and FIG. 10B is a waveform diagram of initialization scan signals and compensation scan signals which are output from a scan driver in a normal frequency mode and in a multi-frequency mode. However, in describing FIG. 10A and FIG. 10B, the same components as those illustrated in FIG. 6A and FIG. 6B are denoted by the same reference numerals, and detailed descriptions of the same components are omitted in order to avoid redundancy.

Referring to FIG. 10A and FIG. 10B, a scan driver 301 according to an embodiment of the inventive concept includes driving stages ST0 to STn. Each driving stage ST0 to STn includes first to fourth input terminals IN1, IN2, IN3, and IN4, first and second voltage terminals V1 and V2, and the first and second output terminals OUT1 and OUT2.

The first voltage VGH may be supplied to a fourth input terminal IN4 of driving stages (hereinafter, normal stages) which supply initialization scan signals SI1 to SIk to initialization scan lines SIL1 to SILk disposed in the first display region DA1 among the driving stages ST0 to STn. The masking signal MS may be supplied to the fourth input terminal IN4 of driving stages (hereinafter, masking stages) which supply the initialization scan signals SIk+1 to SIn to the initialization scan lines SILk+1 to SILn disposed in the second display region DA2 among the driving stages ST0 to STn.

When the position and size of the second display region DA2 vary in the display region DA of the display device DD, the number of normal stages in which the masking signal MS having the first voltage VGH is applied to the fourth input terminal IN4 may vary accordingly.

FIG. 10A illustrates a structure in which the fourth input terminal IN4 of the normal stages is separated from the first voltage terminal V1 but the inventive concept is not limited thereto. For example, when the position of the second display region DA2 is fixed in the display region DA (see FIG. 4) of the display device DD (see FIG. 4), the fourth input terminal IN4 of the normal stages may be integrated with the first voltage terminal V1. In this case, a masking circuit of the normal stages may be connected between the first voltage terminal V1 and the second voltage terminal V2.

The masking signal MS is provided to the masking stages among the driving stages ST0 to STn. In the normal frequency mode NFM, the masking signal MS is maintained at a first level (for example, a high level). Here, the first level may be the same as the level of the first voltage VGH.

The scan driver 301 may output the compensation scan signals SC1 to SCn sequentially activated and initialization scan signals SI1 to SIn sequentially activated during each frame F1, F2, and F3 in the normal frequency mode NFM. As an example of the inventive concept, each of the compensation scan signals SC1 to SCn may have a high level during an active period and may have a low level during an inactive period. In addition, each of the initialization scan signals SI1 to SIn may have a high level during an active period and may have a low level during an inactive period.

In the multi-frequency mode MFM, the driving frame DF includes the full frame FF and partial frames HF1, HF2, HF3, and HF4. FIG. 10B illustrates only 4 partial frames HF1, HF2, HF3, and HF4 among the partial frames HF1, HF2, HF3, and HF4 included in the driving frame DF. However, the number of partial frames HF1, HF2, HF3, and HF4 included in the driving frame DF may vary depending on a driving frequency of the first display region DA1.

In the multi-frequency mode MFM, the masking signal MS may be maintained at the first level during the full frame FF. That is, the masking signal MS may be maintained at the first level during the full frame FF as in the normal frequency mode NFM.

In the multi-frequency mode MFM, when the full frame FF is ended and a first partial frame HF1 is initiated, the masking signal MS may be changed from the first level to a second level (for example, a low level) at a start point t1 of the first partial frame HF1. Here, the second level may be the same as the level of the second voltage VGL. Since the masking signal MS is supplied only to the masking stages, the second level may be maintained during the partial frames HF1 to HF4. When the partial frames HF1 to HF4 are ended and a next full frame is initiated, the masking signal MS may be changed to the first level.

During each partial frame HF1 to HF4, the masking signal MS is maintained at the second level so that the initialization scan lines SILk+1 to SILn and the compensation scan lines SCLk+1 to SCLn disposed in the second display region DA2 may be maintained in an inactive state. As such, the masking signal MS may mask the initialization scan signals SIk+1 to SIn output from masking stages connected to the initialization scan lines SILk+1 to SILn of the second display region DA2 among the driving stages ST0 to STn in an inactive state in the multi-frequency mode MFM.

Figure 11:
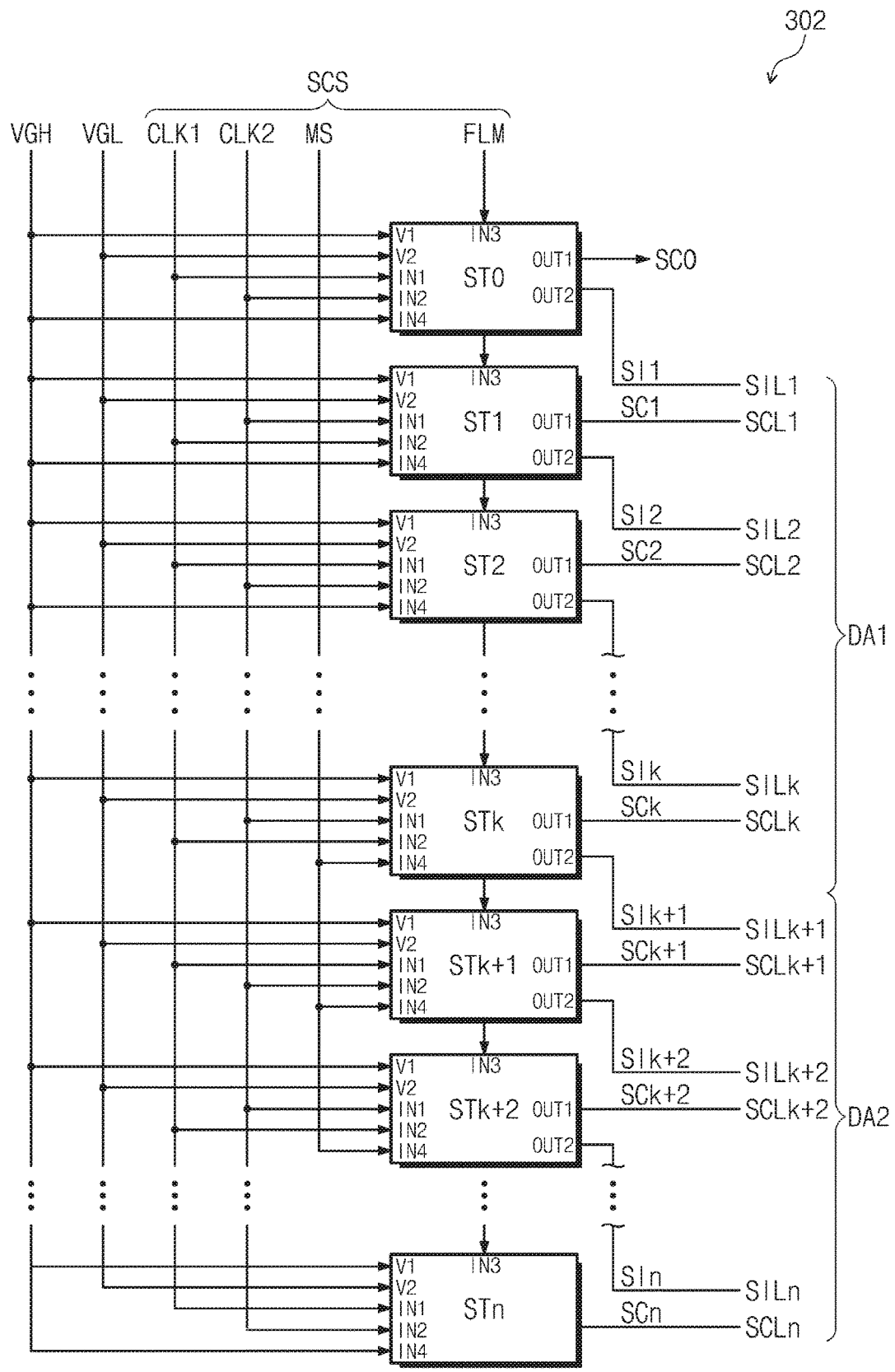
FIG. 11 is a block diagram of a scan driver according to an embodiment of the inventive concept.

FIG. 11 is a block diagram of a scan driver according to an embodiment of the inventive concept.

Referring to FIG. 11, a scan driver 302 according to an embodiment of the inventive concept includes driving stages ST0 to STn. Each driving stage ST0 to STn includes first to fourth input terminals INT1, IN2, IN3, and IN4, first and second voltage terminals V1 and V2, and the first and second output terminals OUT1 and OUT2.

The first voltage VGH may be supplied to a fourth input terminal IN4 of driving stages (hereinafter, normal stages) which supply initialization scan signals SI1 to SIk to initialization scan lines SIL1 to SILk disposed in the first display region DA1 among the driving stages ST0 to STn. Driving stages (hereinafter, masking stages) which supply the initialization scan signals SIk+1 to SIn to the initialization scan lines SILk+1 to SILn disposed in the second display region DA2 among the driving stages ST0 to STn may include first masking stages and second masking stages.

First masking stages STk to STk+2 are driving stages disposed adjacent to the boundary between the first and second display regions DA1 and DA2, and the second stages are the rest of the driving stages except for the first masking stages STk to STk+2 among the masking stages.

The first voltage VGH may be applied to the fourth input terminal IN4 of the normal stages and of the second masking stages. The masking signal MS may be supplied to the fourth input terminal IN4 of the first masking stages STk to STk+2.

FIG. 11 illustrates a structure in which the fourth input terminal IN4 of each of the normal stages and of the second masking stages are separated from the first voltage terminal V1 but the inventive concept is not limited thereto. For example, when the position of the second display region DA2 is fixed in the display region DA (see FIG. 4) of the display device DD (see FIG. 4), the fourth input terminal IN4 of each of the normal stages and of the second masking stages may be integrated with the first voltage terminal V1. In this case, a masking circuit of each of the normal stages and of the second masking stages may be connected between the first voltage terminal V1 and the second voltage terminal V2.

The masking signal MS is supplied to the first masking stages STk to STk+2 among the driving stages ST0 to STn. The masking signal MS may have the same waveform as the masking signal illustrated in FIG. 10B.

FIG. 11 illustrates that the number of the first masking stages STk to STk+2 to which the masking signal MS is applied is 3, but the inventive concept is not limited thereto. The number of the first masking stages STk to STk+2 to which the masking signal MS is applied may be variously set depending on the performance and driving method of the scan driver 302.

Figure 12A:
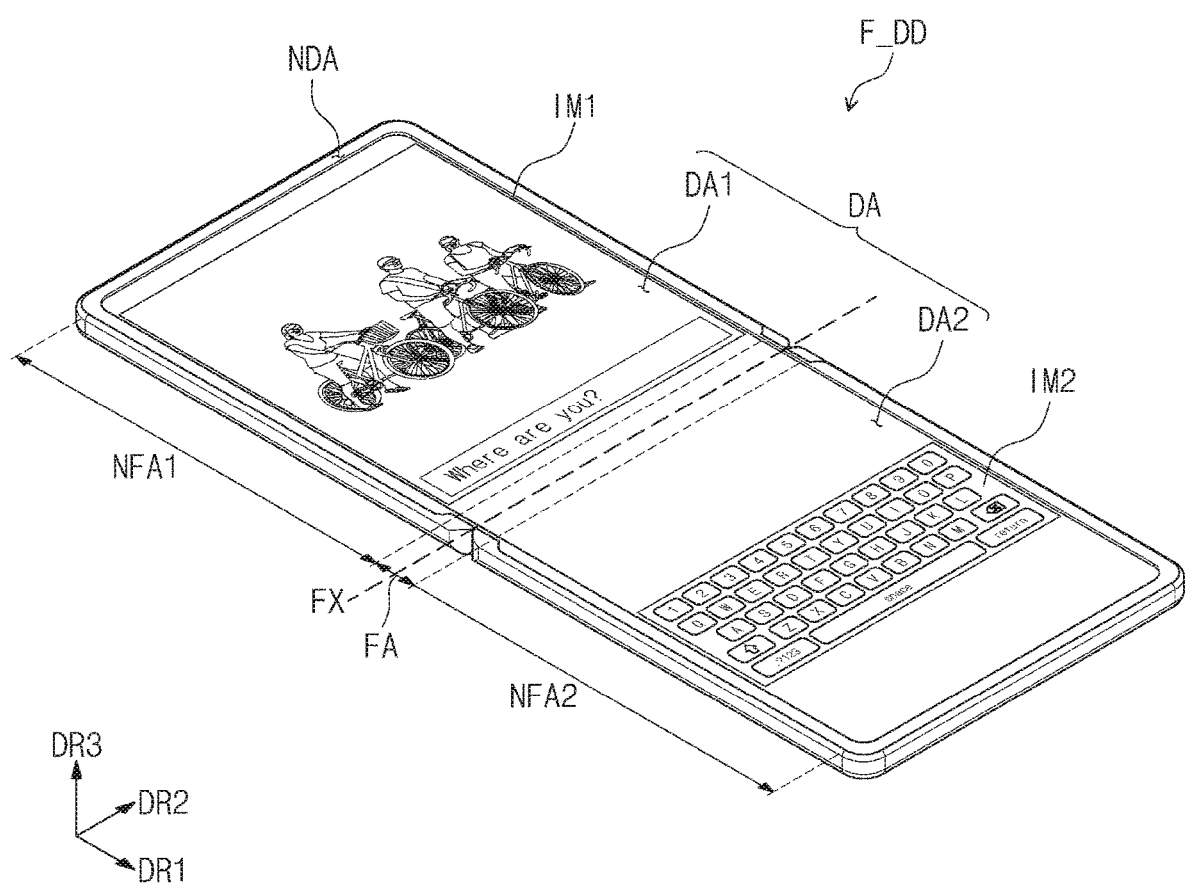
FIG. 12A and FIG. 12B are perspective views of a display device according to an embodiment of the inventive concept.
Figure 12B:
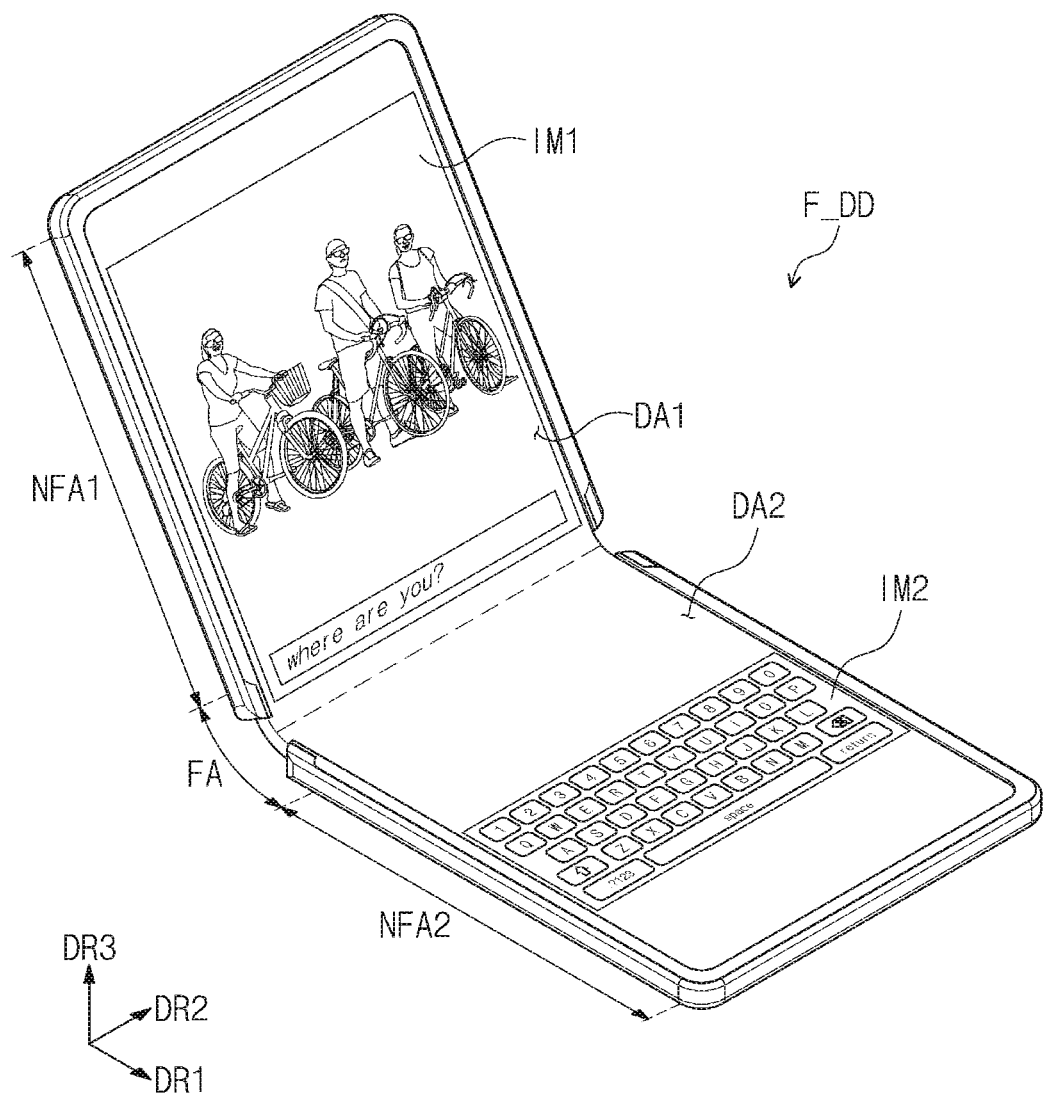

FIG. 12A is a perspective view showing the unfolded state of a display device according to an embodiment of the inventive concept, and FIG. 12B is a perspective view illustrating the folded state of the display device illustrated in FIG. 12A.

FIG. 12A and FIG. 12B exemplarily illustrate that a display device F_DD is a smart phone. However, the embodiment of the inventive concept is not limited thereto. The display device F_DD may include a tablet PC, a smart phone, a personal digital assistant (PDA), a portable multimedia player (PMP), a game console, a wristwatch-type electronic device, and the like. The inventive concept may be used for large electronic devices such as a television or an external advertisement board, and also for small and medium-sized electronic devices such as a personal computer, a laptop computer, a kiosk, a car navigation system unit, and a camera. It should be understood that these are merely examples and may be employed in other electronic devices without departing from the inventive concept.

The display device F_DD includes a display region DA and a non-display region NDA. The display device F_DD may display an image through the display region DA. When the display device F_DD is an unfolded state, the display region DA may include a plane defined by a first direction DR1 and a second direction DR2. The non-display region NDA surrounds the display region DA.

The display region DA may include a first non-folding region NFA1, a folding region FA, and a second non-folding region NFA2. The folding region FA may be bent along a folding axis FX extending along the first direction DR1.

When the display device F_DD is folded, the first non-folding region NFA1 and the second non-folding region NFA2 may face each other. In this case, the display region DA may not be exposed to the outside, which may be referred to as an in-folding state. Optionally, when the display device F_DD is folded, the first non-folding region NFA1 and the second non-folding region NFA2 may oppose each other. In this case, the display region DA may be exposed to the outside, which may be referred to as an out-folding state.

The display device F_DD may perform either an in-folding operation or an out-folding operation. Optionally, the display device F_DD may perform both an in-folding operation and an out-folding operation. In this case, the folding region FA of the display device F_DD may be in-folded and out-folded. Alternatively, some portions of the display device F_DD may be in-folded and the other regions thereof may be out-folded.

In FIG. 12A and FIG. 12B, one folding region FA and two non-folding regions NFA1 and NFA2 are illustrated as an example. However, the number of folding regions and of non-folding regions are not limited thereto. For example, the display device F_DD may include a plurality of non-folding regions which is more than two and a plurality of folding regions disposed between non-folding regions adjacent to each other.

In FIG. 12A and FIG. 12B, the folding axis FX is illustrated as being parallel to a short axis of the display device F_DD but the inventive concept is not limited thereto. For example, the folding axis FX may extend along a long axis of the display device F_DD, for example, a direction parallel to the first direction DR1. In this case, the first non-folding region NFA1, the folding region FA, and the second non-folding region NFA2 may be sequentially arranged along the second direction DR2.

The display region DA of the display device F_DD may include a plurality of display regions DA1 and DA2. In FIG. 12A, two display regions DA1 and DA2 are illustrated as an example. However, the number of the plurality of display regions DA1 and DA2 included in the display region DA is not limited thereto.

The plurality of display regions DA1 and DA2 may include a first display region DA1 and a second display region DA2. For example, the first display region DA1 may be a region in which a first image IM1 is displayed and the second display region DA2 may be a region in which a second image IM2 is displayed. For example, the first image IM1 may be a moving image and the second image IM2 may be a still image or a text image having a long change cycle.

In a normal frequency mode, the display device F_DD according to an embodiment may drive both the first display region DA1 and the second display region DA2 at a normal frequency. In a multi-frequency mode, the display device F_DD according to an embodiment may drive the first display region DA1 in which the first image IM1 is displayed at a driving frequency higher than the normal frequency and may drive the second display region DA2 in which the second image IM2 is displayed at a driving frequency lower than the normal frequency. The display device F_DD may increase the driving frequency of the first display region DA1 to improve the display quality of a moving image. The display device DD may reduce power consumption by lowering the driving frequency of the second display region DA2.

The size of each of the first display region DA1 and the second display region DA2 may have a predetermined size and may be changed by an application program. In an embodiment, the first display region DA1 may correspond to the first non-folding region NFA1 and the second display region DA2 may correspond to the second non-folding region NFA2. In addition, a portion of the folding region FA may correspond to the first display region DA1, and the other portion of the folding region FA may correspond to the second display region DA2.

In an embodiment, the first display region DA1 may correspond to a portion of the first non-folding region NFA1 and the second display region DA2 may correspond to the other portion of the first non-folding region NFA1, the folding region FA, and the second non-folding region NFA2. That is, the area of the second display region DA1 may be greater than the area of the second display region DA2.

In an embodiment, the first display region DA1 may correspond to the first non-folding region NFA1, the folding region FA, and a portion of the second non-folding region NFA2, and the second display region DA2 may correspond to the other portion of the second non-folding region NFA2. That is, the area of the first display region DA2 may be greater than the area of the first display region DAL As illustrated in FIG. 12B, when the folding region FA is in a folded state, the first display region DA1 may correspond to the first non-folding region NFA1 and the second display region DA2 may correspond to the second non-folding region NFA2.

FIG. 12A and FIG. 12B illustrate a foldable display device F_DD but the inventive concept is not limited thereto. For example, the inventive concept may be applied to a rollable display device and the like.

A display device according to the inventive concept may output a scan signal of a stable level even when including a masking circuit for masking the output of a scan signal.

In addition, since the masking circuit for masking the output of a scan signal is added to each driving stage, the size of an output circuit of each driving stage may be prevented from increasing.

Although the inventive concept has been described with reference embodiments of the inventive concept, it will be understood by those skilled in the art that various modifications and changes in form and details may be made therein without departing from the spirit and scope of the inventive concept as set forth in the following claims. In addition, the embodiments disclosed in the inventive concept are not intended to limit the technical spirit of the inventive concept, and all technical concepts falling within the scope of the following claims and equivalents thereof are to be construed as being included in the scope of the inventive concept.

What is claimed is:

1. A scan driver comprising:
a driving circuit, the driving circuit including:
a control circuit configured to output a first control signal to a first node and a second control signal to a second node in response to a clock signal and a carry signal,
a first output circuit connected to a first output terminal which outputs a first scan signal and to a first voltage terminal to which a first voltage is supplied, and configured to operate in response to the first control signal, and
a second output circuit connected to the first output terminal and a second voltage terminal to which a second voltage is supplied, and configured to operate in response to the second control signal; and
a masking circuit configured to receive the first control signal and the second control signal and output a second scan signal to a second output terminal in response to the first control signal and the second control signal, the masking circuit being connected to an input terminal to which a masking signal is supplied and configured to control the voltage level of the second scan signal in accordance with the masking signal,
wherein the masking signal has a first level and is deactivated in a normal frequency mode, and the masking signal comprises an inactive period having the first level and an active period having a second level in a multi-frequency mode.

2. The scan driver of claim 1, wherein the masking circuit is connected between one of the first voltage terminal and the second voltage terminal, and the input terminal.

3. The scan driver of claim 2, wherein the masking circuit comprises:
a first masking circuit connected between the input terminal and the second output terminal, a control electrode of the first masking circuit being connected to the first node to transmit the masking signal to the second output terminal in response to the first control signal; and
a second masking circuit connected between the second output terminal and the second voltage terminal, a control electrode of the second masking circuit being connected to the second node to transmit the second voltage to the second output terminal in response to the second control signal.

4. The scan driver of claim 3, wherein:
the first masking circuit comprises a first masking transistor including a control electrode connected to the first node, a first electrode connected to the input terminal, and a second electrode connected to the second output terminal; and
the second masking circuit comprises a second masking transistor including a control electrode connected to the second node, a first electrode connected to the second voltage terminal, and a second electrode connected to the second output terminal.

5. The scan driver of claim 4, wherein:
the first output circuit comprises a first output transistor including a control electrode connected to the first node, a first electrode connected to the first voltage terminal, and a second electrode connected to the first output terminal; and
the second output circuit comprises a second output transistor including a control electrode connected to the second node, a first electrode connected to the second voltage terminal, and a second electrode connected to the first output terminal.

6. The scan driver of claim 3, wherein the first level is the same as the level of the first voltage and the second level is the same as the level of the second voltage.

7. The scan driver of claim 6, wherein the clock signal comprises a first period having a third level and a second period having a fourth level.

8. The scan signal of claim 6, wherein the fourth level is the same as the level of the second voltage in the normal frequency mode, and the fourth level is lower than the level of the second voltage during the inactive period of the masking signal in the multi-frequency mode.

9. The scan driver of claim 3, wherein the first level is the same as the level of the first voltage, and the second level is lower than the level of the first voltage and higher than the level of the second voltage.

10. The scan driver of claim 2, wherein the masking circuit comprises:
a first masking circuit connected between the first voltage terminal and the second output terminal, a control electrode of the first masking circuit being connected to the first node to transmit the first voltage to the second output terminal in response to the first control signal; and
a second masking circuit connected between the input terminal and the second output terminal, a control electrode of the second masking circuit being connected to the second node to transmit the masking signal to the second output terminal in response to the second control signal.

11. The scan driver of claim 10, wherein the first level is the same as the level of the second voltage, and the second level is the same as the level of the first voltage.

12. The scan driver of claim 1, wherein the masking circuit comprises:
a first input terminal to which a first masking signal of the masking signal is supplied; and
a second input terminal to which a second masking signal of the masking signal is supplied.

13. The scan driver of claim 12, wherein the masking circuit further comprises:
a first masking circuit connected between the first input terminal and the second output terminal, a control electrode of the first masking circuit being connected to the first node to transmit the first masking signal to the second output terminal in response to the first control signal; and
a second masking circuit connected between the second input terminal and the second output terminal, a control electrode of the second masking circuit being connected to the second node to transmit the second masking signal to the second output terminal in response to the second control signal.

14. The scan driver of claim 13, wherein:
the first masking signal has the first level which is the same as the level of the first voltage and is deactivated in the normal frequency mode,
the first masking signal has the inactive period having the first level and the active period having the second level which is the same as the level of the second voltage in the multi-frequency mode, and
the second masking signal maintains the second level in the normal frequency mode and the multi-frequency mode.

15. The scan driver of claim 13, wherein:
the second masking signal has a first level which is the same as the level of the second voltage and is deactivated in the normal frequency mode;
the second masking signal has the inactive period having the first level and the active period having the second level which is the same as the level of the first voltage in the multi-frequency mode; and
the first masking signal maintains the second level in the normal frequency mode and the multi-frequency mode.

16. A display device comprising:
a display panel including a plurality of pixels respectively connected to a plurality of data lines, a plurality of compensation scan lines, and a plurality of initialization scan lines;
a data driver configured to drive the plurality of data lines;
a scan driver configured to drive the plurality of compensation scan lines and the plurality of initialization scan lines; and
a driving controller configured to control the data driver and the scan driver so as to allow an image to be displayed on the display panel, wherein the scan driver includes a driving stage configured to output a compensation scan signal to a corresponding compensation scan line among the compensation scan lines, and to output an initialization scan signal to a corresponding initialization scan line among the initialization scan lines,
wherein the driving stage includes:
a driving circuit including a control circuit configured to output a first control signal to a first node and a second control signal to a second node in response to a clock signal and a carry signal, a first output circuit connected to a first output terminal which outputs the compensation scan signal and a first voltage terminal to which a first voltage is supplied, and configured to operate in response to the first control signal, and a second output circuit connected to the first output terminal and a second voltage terminal to which a second voltage is supplied, and configured to operate in response to the second control signal; and
a masking circuit configured to receive the first control signal and the second control signal and output the initialization scan signal to a second output terminal in response to the first control signal and the second control signal, the masking circuit being connected to an input terminal to which a masking signal is supplied, thereby controlling the voltage level of the initialization scan signal in accordance with the masking signal,
wherein the masking signal has a first level which is the same as the level of the first voltage and is deactivated in a normal frequency mode, and the masking signal has an inactive period having the first level and an active period having a second level which is the same as the level of the second voltage in a multi-frequency mode.

17. The display device of claim 16, wherein the masking circuit comprises:
a first masking transistor including a control electrode connected to the first node, a first electrode connected to the input terminal, and a second electrode connected to the second output terminal, and
a second masking transistor including a control electrode connected to the second node, a first electrode connected to the second voltage terminal, and a second electrode connected to the second output terminal.

18. The display device of claim 17, wherein:
the first output circuit comprises a first output transistor including a control electrode connected to the first node, a first electrode connected to the first voltage terminal, and a second electrode connected to the first output terminal; and
the second output circuit comprises a second output transistor including a control electrode connected to the second node, a first electrode connected to the second voltage terminal, and a second electrode connected to the first output terminal.

* * * * *